United States Patent
Fujii et al.

[19]

[11] Patent Number: 6,110,775
[45] Date of Patent: Aug. 29, 2000

[54] PROCESS FOR FABRICATION OF A DRAM CELL HAVING A STACKED CAPACITOR

[75] Inventors: Toyokazu Fujii, Nara; Takatoshi Yasui, Osaka, both of Japan

[73] Assignee: Matsushita Electronics Corporation, Osaka, Japan

[21] Appl. No.: 09/018,181

[22] Filed: Feb. 3, 1998

[30] Foreign Application Priority Data

Feb. 4, 1997 [JP] Japan .................................. 9-021127

[51] Int. Cl.[7] .................... H01L 21/8242; H01L 21/20
[52] U.S. Cl. .......................................... 438/254; 438/397
[58] Field of Search ................................ 438/253, 254, 438/396, 397

[56] References Cited

U.S. PATENT DOCUMENTS 5,399,518  3/1995  Sim ........................................... 437/52

*Primary Examiner*—Brian Dutton
*Attorney, Agent, or Firm*—McDermott, Will & Emery

[57] ABSTRACT

A DRAM cell transistor formed on a silicon substrate comprises a first BPSG film, a silicon oxide film as a supporting film laid thereover, a storage node including a contact portion filling a contact hole extended through the silicon oxide film and the first BPSG film, an oxidized silicon nitride film as a capacitor insulating film, and a plate electrode. There may be further provided a second BPSG film thereover. Even if the first BPSG film at a lower level is caused to reflow by a process for oxidizing the silicon nitride film for formation of the oxidized silicon nitride film as the capacitor insulating film or a process for ref lowing the second BPSG film, the silicon oxide film as the supporting film applies to the capacitor insulating film a stress against the deformation thereof and hence, the oxidized silicon nitride film free from wrinkle or cracks is provided as the capacitor insulating film. Thus, a semiconductor device free from wrinkle or cracks in the nitride film associated with thermal history and a process for fabrication of the same can be offered, even though the nitride film is laid over the insulating film having a reflowable property.

9 Claims, 19 Drawing Sheets

PROCESS FOR FABRICATION OF A DRAM CELL HAVING A STACKED CAPACITOR

BACKGROUND OF THE INVENTION

The present invention generally relates to a semiconductor device comprising a substrate and an interlayer insulating film having a thermally reflowable property and a fabrication process therefor, and more particularly to a countermeasure against deformation of a nitride film overlying the interlayer insulating film.

With progress toward high-integration, the prior-art semiconductor device has an increasing number of interconnection layers formed on the substrate. Accordingly, it is common practice in the art to perform a process comprising the steps of laying a first BPSG film over a first interconnection layer, followed by heat treating the first BPSG film for planarization thereof, and forming a second interconnection layer and then a second BPSG film on the first BPSG film, followed by planarization of the second BPSG film. This process has a drawback that when the second BPSG film is heat treated, the first BPSG film is also caused to reflow and dislocation of the second interconnection layer results. As prevention against this problem, a process including a step to lay a silicon nitride film over the first BPSG film is disclosed in Laid Open Unexamined Japanese Patent Publication No.5(1993)-160276.

FIG. 16 is a sectional view showing an example of the prior-art semiconductor device including such a silicon nitride film for prevention against the reflow of the second interconnection layer. As seen in FIG. 16, the semiconductor device is arranged such that a transistor gate 47 as the first interconnection layer is formed on a silicon substrate, a first BPSG film 48 as the first interlayer insulating film laid over the gate 47, a polycide interconnection 49 as the second interconnection layer formed on the first BPSG film 48. Formed on the first BPSG film 48 is a polycide interconnection 49 as the second interconnection layer. A protective silicon nitride film 50 is laid over the first BPSG film 48 for the purpose of preventing the reflow and oxidation of the first BPSG film and subsequently, a second BPSG film 51 as the second interlayer insulating film is laid over the silicon nitride film 50. This process is designed to utilize the silicon nitride film 50 for blocking vapor during the heat treatment for planarizing the second BPSG film 51 in an atmosphere of vapor, thereby preventing the reflow of the first BPSG film 48 and thus avoiding defects caused by dislocation of the polycide interconnection 49.

A method of fabricating a stacked DRAM cell often utilizes an oxidized silicon nitride film as a capacitor insulating film generally presenting prescribed properties such as refresh, isolation voltage and the like. Further, the BPSG film is of ten utilized for planarizing the base of a storage node.

Now referring to FIG. 17, a brief description will be made on the prior-art stacked DRAM structure. As seen in FIG. 17, the stacked DRAM structure comprises a silicon substrate 1, an overlying BPSG film 52 reflowable by a heat treatment at low temperatures, a storage node 54 including a contact portion 53 connected to an impurity diffusion layer in the silicon substrate 1, an oxidized silicon nitride film 55 serving as the capacitor insulating film, and a plate electrode 56. In such a structure, the oxidized silicon nitride film 55 as the capacitor insulating film exists partially on the BPSG film 52.

In addition, there is proposed a stacked DRAM structure including a cylindrical storage node for increasing the surface area of the storage node.

As seen in FIG. 18, this structure comprises a silicon substrate 1, a BPSG film 57 reflowable by a heat treatment at low temperatures, a silicon nitride film 58 serving as a wet etching stopper, a cylindrical storage node 60 including a contact portion 59 and connected to an impurity diffusion layer in the substrate 1, an oxidized silicon nitride film 61 serving as the capacitor insulating film, and a plate electrode 62. In this structure, as well, the oxidized silicon nitride film 61 as the capacitor insulating film exists partially on the BPSG film 57.

The aforementioned semiconductor devices known to the art have the following problems.

More recently, in response to a demand for fabricating a semiconductor device at lower temperatures, the BPSG film need be heat treated at lower temperatures. In order that such a low-temperature heat treatment may accomplish a similar flow and forming of the film to that offered by the heat treatment practiced in the art, the BPSG film contains boron and phosphorus in high concentrations. With the use of such a high-concentration BPSG film, the process wherein the silicon nitride film is deposited and oxidized to obtain the oxidized silicon nitride film shown in FIG. 17 or 18 have a drawback that a first BPSG film 63 tends to reflow so readily as to produce wrinkle in the silicon nitride film 64, as shown in FIG. 19A. The inventors of the present invention have found from experiments that the wrinkle tends to occur at a wide area with a low density of memory cells as well as at place under which a step in the first BPSG film 63 as the base is located. It was also found that as the thickness of the silicon nitride film 64 as the capacitor insulating film decreases, the incidence of wrinkle becomes greater.

The inventors investigated the cause of the above phenomenon to infer that the phenomenon may be caused by an action described as below. It is generally known that since the silicon oxide film, such as BPSG film, and the silicon nitride film differ in the thermal expansion coefficient and the crystallographic structure, a great stress is produced in an interface between the both films in lamination. Actually, the silicon nitride film is under tension of the thicker BPSG film. Accordingly, when the BPSG film reflows, the silicon nitride film is released from the tensile stress which has been applied thereto by the BPSG film whereby the silicon nitride film tends to shrink. As a consequence, wrinkle or cracks may occur in the silicon nitride film.

Further investigation demonstrated that in case where the silicon nitride film is thick, particularly where the cylindrical storage node 60 is formed, as shown in FIG. 18, and the silicon nitride film 58 is used as the wet etching stopper, a silicon nitride film 66 may suffer the occurrence of cracks therein, as shown in FIG. 19.

It was also found that even in a structure including the silicon nitride film 50 shown in FIG. 16, the heat treatment for planarizing the second BPSG film 51 may disadvantageously produce a partial reflow of the first BPSG film 48, thus involving a danger of producing the aforesaid wrinkle or cracks in the silicon nitride film. Supposedly, this may be because the silicon nitride film 50 does not completely block vapor penetrating therethrough downward but rather allows an amount of gases, such as vapor, to penetrate therethrough.

Hence, the conventional technique cannot ensure that even a part of the silicon nitride film does not suffer the occurrence of wrinkle or cracks therein in case where after the planarization of the interlayer insulating layer, such as BPSG film having a thermally planarizable property, one of various steps requiring the semiconductor substrate to be kept heated, such as heat treatment for planarizing the upper interlayer insulating film and thermal oxidation, is performed.

SUMMARY OF THE INVENTION

It is therefore, an object of the invention to provide a semiconductor device and a fabrication process therefor which are adapted to prevent the occurrence of wrinkle or cracks in the silicon nitride film despite a degree of reflow of the BPSG film in case where a BPSG film heavily doped with impurities is employed and a subsequent step requires treatment under a high temperature condition.

A semiconductor device according to the invention comprises a substrate having a semiconductor region, a first insulating film formed on the aforesaid semiconductor region and having a property of reflowing due to a heat treatment under predetermined conditions, a second insulating film formed on the aforesaid first insulating film and containing at least silicon nitride, and a supporting film formed on at least one of the upper and lower surfaces of the aforesaid second insulating film thereby functioning to apply thereto a stress against the deformation of the second insulating film caused by the aforesaid heat treatment.

According to this arrangement, even if in the process for fabricating the semiconductor device, a heat treatment under the predetermined conditions is performed after the formation of the second insulating film thereby causing the first insulating film at a lower level to reflow, the second insulating film does not suffer the occurrence of wrinkle or cracks therein because the stress against the deformation of the second insulating film is applied thereto by the supporting film. This leads to the prevention of defective products due to wrinkle or cracks occurred in the second insulating film and hence, an enhanced yield and reliability of the semiconductor devices results. Additionally, the invention allows the planarization of the first insulating film to be performed at lower temperatures, thus contributing to improved performance of the semiconductor device.

A third insulating film may further be provided, which is laid at a higher level than the aforesaid first insulating film and has a thermally reflowable property under the aforesaid predetermined conditions.

With this arrangement, the deformation of the second insulating film can be prevented during a second heat treatment for planarizing the third insulating film.

In the aforesaid semiconductor device, the aforesaid supporting film may be patterned in such a manner as to cover at least a region including a formation region of the aforesaid second insulating film with respect to a common projection plane.

This arrangement allows a formation region of the supporting film to be limited to a minimum range while preventing the deformation of the second insulating film.

Where the aforesaid semiconductor device is a stacked DRAM cell including a gate formed on the aforesaid semiconductor region, an impurity diffusion layer formed in a region sideways of the aforesaid gate in the aforesaid semiconductor region, an interlayer insulating film laid over the aforesaid gate and semiconductor region, a storage node filling an opening formed in the aforesaid interlayer insulating film and extending over a part of the aforesaid interlayer insulating film, a capacitor insulating film for coverage over the aforesaid storage node and interlayer insulating film, and a plate electrode formed in opposed relation with the aforesaid storage node via the aforesaid capacitor insulating film, the aforesaid insulating film may define the aforesaid interlayer insulating film, the aforesaid second insulating film may define the aforesaid capacitor insulating film, and the aforesaid supporting film may define an insulating film interposed between the aforesaid interlayer insulating film and the aforesaid capacitor insulating film.

This arrangement offers the above described effect to the stacked DRAM cell, thus realizing a stacked DRAM cell free from wrinkle or cracks in the capacitor insulating film and featuring high performance and reliability.

Where the aforesaid semiconductor device is a stacked DRAM cell including a gate formed on the aforesaid semiconductor region, an impurity diffusion layer formed in a region sideways of the aforesaid gate in the aforesaid semiconductor region, an interlayer insulating film laid over the aforesaid gate and semiconductor region, a storage node filling an opening formed in the aforesaid interlayer insulating film and extending over a part of the aforesaid interlayer insulating film, a capacitor insulating film formed for coverage of the aforesaid storage node and interlayer insulating film, and a plate electrode formed in opposed relation with the aforesaid storage node via the aforesaid capacitor insulating film, the aforesaid first insulating film may define the aforesaid interlayer insulating film, the aforesaid second insulating film may define the aforesaid capacitor insulating film, and the aforesaid supporting film may define the aforesaid plate electrode.

This arrangement does not require the provision of an additional supporting film but is adapted to prevent the deformation of the capacitor insulating film during the heat treatment by way of the plate electrode.

Where the aforesaid storage node is a cylindrical storage node, it is preferred to add an etching stopper film laid over the aforesaid supporting film and under the aforesaid storage node and capacitor insulating film as interposed therebetween, and serving as an etching stopper during the formation of the cylindrical storage node.

This arrangement provides a cylindrical stacked DRAM cell free from wrinkle or cracks in the capacitor insulating film and featuring high performance and reliability.

The aforesaid second insulating film may comprise an oxidized silicon nitride film.

This arrangement assures prevention of the occurrence of wrinkle or cracks in the second insulating film if the fabrication process for semiconductor device includes a step to oxidize the a silicon nitride film composing the second insulating film for obtaining the oxidized silicon nitride film and therefore, a semiconductor device featuring good flatness as a whole as well as high performance and reliability is provided. Particularly, forming the capacitor insulating film in the DRAM cell of the oxidized silicon nitride film provides a capacitor insulating film featuring good bondability with the plate electrode and excellent dielectric properties. This contributes to an improved performance of the semiconductor device.

Where the aforesaid semiconductor device is a stacked DRAM cell including a gate formed on the aforesaid semiconductor region, an impurity diffusion layer formed in a region sideways of the aforesaid gate in the aforesaid semiconductor region, an interlayer insulating film laid over the aforesaid gate and semiconductor region, a storage node filling an opening formed in the aforesaid interlayer insulating film and extending over a part of the aforesaid interlayer insulating film, a capacitor insulating film formed for coverage over the aforesaid storage node and interlayer insulating film, and a plate electrode formed in opposed relation with the aforesaid interlayer insulating film via the aforesaid capacitor insulating film, the aforesaid first insulating film may define the aforesaid interlayer insulating film, the aforesaid second insulating film defining the aforesaid capacitor insulating film and comprising an oxidized silicon nitride film obtained by oxidizing a silicon nitride film, the aforesaid supporting film defining the aforesaid plate electrode and covering at least a region including a formation region of the aforesaid capacitor insulating film with respect to a common projection plane, the aforesaid upper interlayer insulating film not reflowable by a thermal oxidation process for forming the aforesaid oxidized silicon nitride film.

This arrangement assures the prevention of occurrence of wrinkle or the like in the silicon nitride film if the fabrication process for the stacked DRAM cell includes a step to thermally oxidize the silicon nitride film for obtaining the oxidized silicon nitride film. Even if an interlayer insulating film having a thermally reflowable property is further provided at a higher level, the capacitor insulating film does not suffer the occurrence of wrinkle or cracks therein because the capacitor insulating film is supported by the overlying plate electrode during the planarization of the upper interlayer insulating film. Thus is provided a stacked DRAM cell free from wrinkle or cracks in the capacitor insulating film, or featuring high performance and reliability.

A lower surface of a cylindrical portion of the aforesaid cylindrical storage node may be spaced from a top surface of the aforesaid etching stopper film so that the aforesaid capacitor insulating film is formed for coverage over the surfaces of the aforesaid cylindrical storage node and etching stopper film.

This arrangement increases a total area of the capacitor insulating film, thus offering a cylindrical stacked DRAM cell featuring excellent refresh characteristic without isolation voltage decrease.

The aforesaid etching stopper film preferably comprises a silicon nitride film.

This arrangement makes advantage of the silicon nitride film having a high etching selectivity to both a polysilicon film and silicon oxide film thereby offering a semiconductor device readily fabricated at low costs.

The aforesaid storage node may be a cylindrical storage node whereas the aforesaid supporting film may comprise a TEOS film serving as the etching stopper film during the formation of the cylindrical storage node.

This arrangement makes advantage of the TEOS film having a high etching selectivity to both the polysilicon film and BPSG film thereby offering a semiconductor device readily fabricated at low costs.

The aforesaid first insulating film preferably comprises a BPSG film.

This arrangement makes advantage of the BPSG film reflowable at low temperatures thereby offering a semiconductor device having the first insulating film with good flatness and featuring high performance and reliability.

The aforesaid supporting film preferably comprises a silicon oxide film.

This arrangement makes advantage of the silicon oxide film readily formed and not adversely affecting the properties of the semiconductor device thereby offering a semiconductor device featuring high performance and reliability and low cost fabrication.

A process for fabrication of a semiconductor device according to a first aspect of the invention comprises the steps of a first step to deposit on a semiconductor substrate a first insulating film having a property of ref lowing due to a heat treatment under predetermined conditions; a second step to perform a first heat treatment under the aforesaid predetermined conditions thereby causing the aforesaid first insulating film to reflow for planarization thereof; a third step to lay a second insulating film containing silicon nitride over the aforesaid first insulating film; a fourth step conducted after the aforesaid second step and either prior to or subsequent to the aforesaid third step so as to form on the substrate a supporting film having a property of not ref lowing due to a heat treatment under the aforesaid predetermined conditions; a fifth step following the aforesaid fourth step so as to deposit on the substrate a third insulating film having a property of reflowing due to a heat treatment under the aforesaid predetermined conditions; and a sixth step to perform a second heat treatment under the aforesaid predetermined conditions thereby causing the aforesaid third insulating film to reflow for planarization thereof, the aforesaid sixth step wherein a stress against the deformation of the aforesaid second insulating film is applied thereto by the aforesaid supporting film.

According to this process, when at least a part of the first insulating film reflows during the heat treatment under the predetermined conditions, the second insulating film tends to deform because the second insulating film containing silicon nitride is released from a stress having been applied thereto. However, the stress against the deformation of the second insulating film is applied thereto by the supporting film and therefore, the occurrence of wrinkle or cracks in the second insulating film is prevented. Thus is provided a semiconductor device featuring high performance and reliability.

There may be further added a step conducted after the aforesaid third and fourth step and prior to the aforesaid fifth step so as to pattern the aforesaid second insulating film and supporting film in a manner such that the aforesaid supporting film may cover at least a region including a formation region of the aforesaid second insulating film with respect to a common projection plane.

According to this process, the supporting film invariably exists at an area where the second insulating film exists, thus ensuring the prevention of deformation of the second insulating film during the fabrication process.

The aforesaid fourth step may be conducted prior to the aforesaid third step and there may be further added a step following the aforesaid third step so as to perform a third heat treatment under the aforesaid predetermined conditions thereby oxidizing a surface of the aforesaid second insulating film for formation of an oxidized silicon nitride film thereon, the aforesaid step to perform the third heat treatment wherein a stress against the deformation of the aforesaid second insulating film is applied thereto by the aforesaid supporting film.

According to this process, when the third insulating film is subject to the heat treatment under the predetermined conditions for planarization thereof, as well, the occurrence of wrinkle or cracks in the second insulating film is prevented by the aforementioned function of the supporting film. Thus is provided a semiconductor device featuring high performance and reliability.

A process for fabrication of a semiconductor device according to a second aspect of the invention pertains a semiconductor device functioning as a stacked DRAM cell and comprises the steps of a first step to deposit a first insulating film on a semiconductor substrate having an impurity diffusion layer, the fist insulating film having a property of ref lowing due to a heat treatment under predetermined conditions; a second step to perform a first heat treatment under the aforesaid predetermined conditions thereby causing the aforesaid first insulating film to reflow for planarization thereof; a third step following the aforesaid second step so as to form a supporting film having a property of not reflowing due to a heat treatment under the aforesaid predetermined conditions; a fourth step to form a contact hole extending through the aforesaid supporting film and first insulating film and to the aforesaid impurity diffusion layer; a fifth step to deposit a first conductive film for storage node on the substrate including the aforesaid contact hole; a sixth step to subject the aforesaid first conductive film for storage node to a patterning process for formation of a storage node connected to the aforesaid impurity diffusion layer; a seventh step following the aforesaid sixth step so as to deposit a second insulating film comprising a silicon nitride film for coverage over exposed surfaces of the aforesaid storage node and of the aforesaid supporting film; an eighth step following the aforesaid seventh step so as to perform a second heat treatment under the aforesaid predetermined conditions thereby oxidizing a surface of the aforesaid second insulating film for formation of a capacitor insulating film comprising an oxidized silicon nitride film; and a ninth step following the aforesaid eighth step so as to form a conductive film for plate electrode on the substrate, the aforesaid eighth step wherein a stress against the deformation of the aforesaid second insulating film due to the aforesaid second heat treatment is applied thereto by the aforesaid supporting film.

According to this process, despite a fear that the thermal oxidation of the silicon nitride film may cause the first insulating film to reflow during the formation of the oxidized silicon nitride film composing the capacitor insulating film for stacked DRAM cell, the supporting film already interposed between the silicon nitride film and the first insulating film prevents the occurrence of wrinkle or cracks in the silicon nitride film. Thus is provided a semiconductor device featuring excellent memory characteristic and high reliability.

The aforesaid third step may comprise forming the supporting film of a TEOS film, and there may be further added steps conducted after the aforesaid fifth step and prior to the aforesaid sixth step so as to form a core for cylindrical storage node of a BPSG film on the aforesaid first conductive film for storage node, and subsequently to form a second conductive film for storage node on the substrate including the aforesaid core for cylindrical storage node, the aforesaid sixth step wherein the aforesaid first and second conductive films for storage node are patterned for forming a cylindrical storage node comprising the aforesaid first and second conductive films for storage node, a step further added to be conducted after the aforesaid sixth step and prior to the aforesaid seventh step so as to remove by etching the aforesaid core of the cylindrical storage node, the aforesaid supporting film serving as an etching stopper film during the aforesaid sixth step and the aforesaid step to remove the aforesaid core of the cylindrical storage node.

This process makes advantage of the TEOS film having a high etching selectivity to a polysilicon film and a BPSG film thereby allowing the formation of the cylindrical storage node without the need for forming an additional film dedicated for etching stopper film as well as preventing the deformation of the capacitor insulating film due to the heat treatment under the predetermined conditions.

There may be further added a step conducted after the aforesaid third step and prior to the aforesaid fourth step so as to lay a film for gap production over the aforesaid supporting film, the aforesaid fourth step wherein the aforesaid contact hole is so formed as to extend through the film for gap production, as well, the aforesaid step to remove the aforesaid core of the cylindrical storage node wherein the aforesaid film for gap production is also removed thereby exposing a surface of the aforesaid cylindrical storage node that contacts the aforesaid film for gap production, the aforesaid seventh step wherein the aforesaid second insulating film is deposited for coverage over the aforesaid exposed surfaces of the cylindrical storage node and the supporting film.

This process provides a cylindrical stacked DRAM cell featuring long retention time, good refresh characteristic and the like, without isolation voltage decrease.

There may be further added a step conducted after the aforesaid second step and prior to the aforesaid third step so as to deposit on the substrate an insulating film for edge retention having a high etching selectivity to the aforesaid first insulating film, the aforesaid third step wherein the aforesaid contact hole is so formed as to extend through the aforesaid insulating film for edge retention, as well.

This process assuredly prevents the step to form the contact hole from forming a contact hole with a chipped edge, which results in an increased size of the contact hole.

A process for fabrication of a semiconductor devise according to a third aspect of the invention pertains a semiconductor device functioning as a cylindrical stacked DRAM cell and comprises the steps of a first step to deposit a first insulating film on a semiconductor substrate having an impurity diffusion layer, the first insulating film having a property of reflowing due to a heat treatment under predetermined conditions; a second step to perform a first heat treatment under the aforesaid predetermined conditions thereby causing the aforesaid first insulating film to reflow for planarization thereof; a third step following the aforesaid second step so as to form a supporting film having a property of not reflowing due to a heat treatment under the aforesaid predetermined conditions; a fourth step to lay over the aforesaid supporting film a film to serve as an etching stopper film during the formation of a cylindrical storage node; a fifth step to form a contact hole extended through the aforesaid etching stopper film, supporting film and first insulating film and to the aforesaid impurity diffusion layer; a sixth step to deposit a first conductive film for storage node on the substrate including the aforesaid contact hole; a seventh step following the aforesaid sixth step so as to form a core for cylindrical storage node on the aforesaid first conductive film for storage node; an eighth step following the aforesaid seventh step so as to form a second conductive film for storage node on the substrate including the aforesaid core for cylindrical storage node; a ninth step to subject the aforesaid first and second conductive films for storage node to a patterning process for formation of a cylindrical storage node comprising the aforesaid first and second conductive films for storage node; a tenth step following the aforesaid ninth step so as to remove by etching the aforesaid core of the cylindrical storage node; an eleventh step following the aforesaid tenth step so as to deposit a second insulating film comprising a silicon nitride film for coverage over exposed surfaces of the aforesaid cylindrical storage node and of the aforesaid supporting film; a twelfth step following the aforesaid eleventh step so as to perform a second heat treatment under the aforesaid predetermined conditions thereby oxidizing a surface of the aforesaid second insulating film for formation of a capacitor insulating film comprising an oxidized silicon nitride film; and a thirteenth step following the aforesaid twelfth step so as to form a conductive film for plate electrode on the substrate, the aforesaid twelfth step wherein a stress against the deformation of both the aforesaid second insulating film and etching stopper film due to the aforesaid second heat treatment is applied thereto by the aforesaid supporting film.

According to this process, the step to form the oxidized silicon nitride film composing the capacitor insulating film for cylindrical stacked DRAM cell entails no occurrence of wrinkle or cracks in the silicon nitride film composing the etching stopper film and capacitor insulating film by virtue of the same effect as in the aforementioned fabrication method for semiconductor device according to the second aspect of the invention. The presence of the etching stopper film facilitates the fabrication of the cylindrical storage node and thus is provided a cylindrical stacked DRAM cell featuring excellent memory characteristic and high reliability.

A process for fabrication of a semiconductor device according to a fourth aspect of the invention pertains a semiconductor device functioning as a stacked DRAM cell and comprises the steps of a first step to deposit a first insulating film on a semiconductor substrate having an impurity diffusion layer, the first insulating film having a property of ref lowing due to a heat treatment under predetermined conditions; a second step to perform a first heat treatment under the aforesaid predetermined conditions thereby causing the aforesaid first insulating film to reflow for planarization thereof; a third step following the aforesaid second step so as to deposit on the substrate a second insulating film comprising a silicon nitride film; and a fourth step following the aforesaid third step so as to perform a second heat treatment under conditions such as not to cause the aforesaid first insulating film to reflow thereby oxidizing a surface of the aforesaid second insulating film for formation of a capacitor insulating film comprising an oxidized silicon nitride film.

According to this process, the reflow of the first insulating film is prevented during the thermal oxidation of the silicon nitride film, so that the occurrence of wrinkle or cracks in the silicon nitride film due to the thermal oxidation process is positively prevented without additional provision of the supporting film.

Specific methods for practicing this process are as follows.

The aforesaid first step may comprise deposition of the first insulating film comprising a BPSG film reflowable at temperatures of not less than 830° C. whereas the aforesaid seventh step may comprise thermal oxidation performed at temperatures of not more than 820° C.

The aforesaid first step may comprise deposition of the first insulating film comprising a BPSG film containing 2.0 to 6.0 wt % phosphorus and 1.0 to 4.0 wt % boron.

The aforesaid seventh step may comprise dry thermal oxidation.

This method makes advantage of that the first insulating film is harder to reflow in dry atmosphere than in a pyrogenic atmosphere thereby ensuring the prevention of reflow of the first insulating film even when the thermal oxidation is performed at higher temperatures.

There may be further added a step conducted prior to the aforesaid sixth step so as to nitride exposed surfaces of the aforesaid first insulating film.

The process speeds up the initiation of nitriding for laying a silicon nitride film over the first insulating film, thus increasing the thickness of the resultant silicon nitride film. This is effective to reduce the amount of oxygen penetrating the silicon nitride film during subsequent processes performed at elevated temperatures thereby reducing tendency of the first insulating film to reflow. Thus is provided a stacked DRAM cell having a capacitor insulating film free from wrinkle or cracks.

The aforesaid nitriding step preferably comprises heat treatment performed in an atmosphere of nitrogen or ammonia.

DESCRIPTION OF PREFERRED EMBODIMENTS (First Embodiment)

Figure 1:
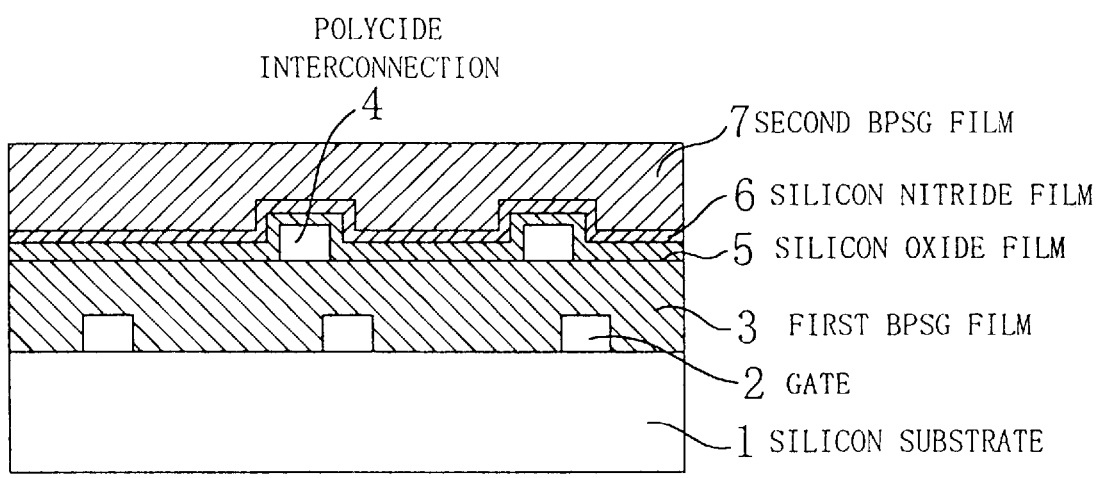
FIG. 1 is a sectional view showing a structure of a semiconductor device having a polycide interconnection in accordance with a first embodiment of the invention.

FIG. 1 is a sectional view partially showing a semiconductor device according to a first embodiment of the invention. For simplicity, FIG. 1 shows only a step at a gate but the semiconductor device of this embodiment includes a plurality of steps such as at a LOCOS isolation, gate and the like. The semiconductor device comprises a silicon substrate 1, a gate 2 as a first interconnection layer, a first BPSG film 3 (Boro-Phospho-silicate Glass) as a first insulating film (a lower interlayer insulating film) having a property of reflowing due to a heat treatment under predetermined conditions, a polycide interconnection 4 as a second interconnection layer comprising a lamination of a silicide film and a polysilicon film, a silicon oxide film 5 as a supporting film having a property of not reflowing due to a heat treatment under the aforesaid predetermined conditions causing the reflow of the first BPSG film, a silicon nitride film 6 as a second insulating film, and a second BPSG film 7 as a third insulating film (an upper interlayer insulating film) reflowable by a heat treatment under the aforesaid predetermined conditions.

Next, with reference to FIGS. 2A to 2D, description will be made on a method for fabrication of the semiconductor device with the structure shown in FIG. 1.

Figure 2A:
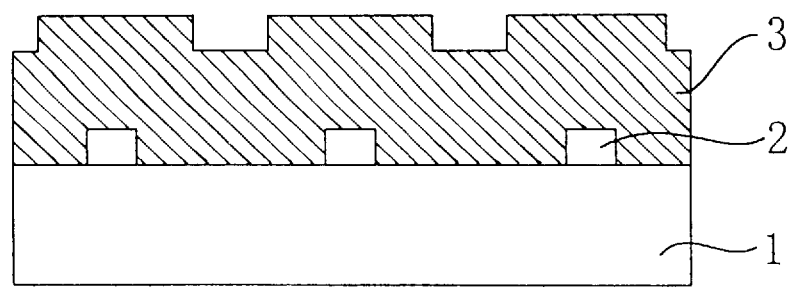
FIGS. 2A to 2D are sectional views for illustrating steps for fabricating the semiconductor device according to the first embodiment hereof.

First, in a step shown in FIG. 2(A), the gate 2 is formed on the silicon substrate 1 and subsequently, the first BPSG film 3 is deposited on the substrate. At this time, the first BPSG film 3 contains phosphorus and boron as impurities in concentration of not less than 3.0 wt %, respectively. It is preferred that the first BPSG film 3 has a thickness more than double the thickness of the gate 2 because the first BPSG film 3 presents a better flatness as subjected to a heat treatment to be performed afterwards.

Figure 2B:
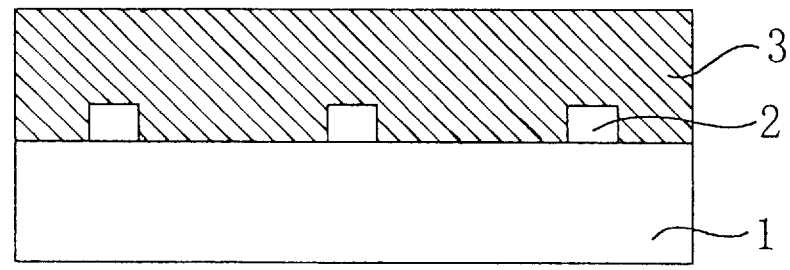

In a step shown in FIG. 2B, a heat treatment is performed for planarizing the first BPSG film 3. The first BPSG film 3 can be planarized by heat treatment, for example, at 850° C. in an atmosphere of nitrogen for 30 minutes. If the heat treatment is performed in an oxidation atmosphere, a like degree of flatness can be accomplished at a temperature of 800° C., provided that a nitride film as an antioxidation film must be laid under the first BPSG film 3.

Figure 2C:
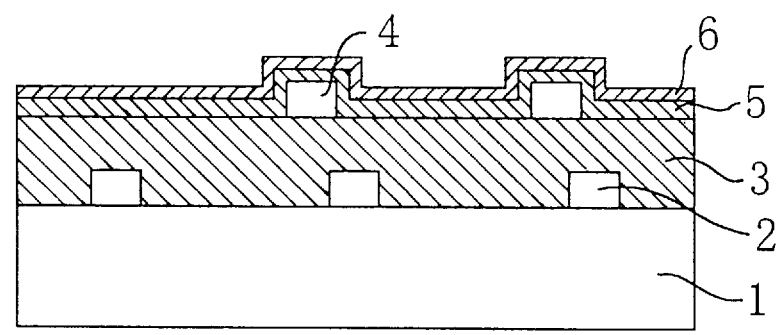

Next, as shown in FIG. 2C, the polycide interconnection 4 as the second interconnection layer is formed. Subsequently, the silicon oxide film 5 as the supporting film and the silicon nitride film 6 are deposited on the substrate. In this case, the silicon oxide film 5 has a thickness of 50 nm whereas the silicon nitride film 6 has a thickness of 50 nm. Incidentally, it is not necessarily required that the second interconnection layer be comprised of the polycide film. The second insulating film may comprise a polysilicon film or a silicide film as long as such a film sufficiently withstand a heat treatment for planarizing the second BPSG film 7.

Figure 2D:
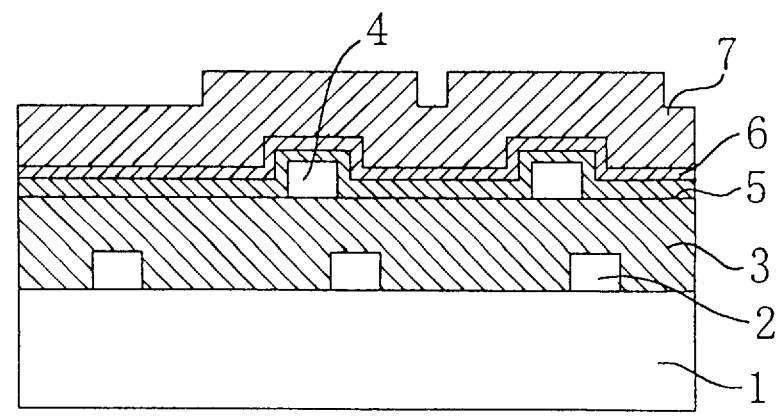

In the subsequent step shown in FIG. 2D, the second BPSG film 7 as the third insulating film (an upper interlayer insulating film) is deposited on the substrate. At this time, the second BPSG film 7 contains phosphorus and boron as impurities in concentration of not less than 3.0 wt %, respectively. The second BPSG film 7 preferably has a thickness more than double that of the polycide interconnection 4 because, as described above, the second BPSG film 7 presents a better flatness as subjected to a subsequent heat treatment. As deposited on the substrate, the second BPSG film 7 is subject to the heat treatment for planarization thereof. The second BPSG film 7 can be planarized by performing the heat treatment, for example, at 850° C. in an oxidation atmosphere for 30 minutes. Thereafter, a normal process is performed wherein metallization of a desired pattern is provided and thus is completed the semiconductor device shown in FIG. 1.

According to this embodiment, even if the first BPSG film 3 already planarized reflows in the heat treatment for planarizing the second BPSG film 7, the silicon oxide film 5 not reflowable by the heat treatment at this temperature is interposed between the silicon nitride film 6 and the first BPSG film 3. The silicon oxide film 5 applies to the silicon nitride film 6 a resistant stress, namely a tensile stress against shrinkage thereof. As already described, in the prior-art structure, the reflow of the underlying BPSG film releases the tensile stress having been applied to the silicon nitride film thereby allowing the silicon nitride film to shrink and hence, wrinkle or cracks occur in the silicon nitride film. In contrast, the embodiment of the invention assures the prevention of occurrence of wrinkle or cracks in the silicon nitride film 6 because the stress against the shrinkage of the silicon oxide film 5 is applied thereto by the silicon oxide film 5.

By virtue of the presence of the silicon nitride film 6 blocking oxygen penetration, the polycide interconnection 4 and the gate 2 are not oxidized even in the oxidation atmosphere and therefore, the heat treatment for film planarization may be performed in the oxidation atmosphere. More specifically, the heat treatment for film planarization may be performed at lower temperatures than the heat treatment in an atmosphere of nitrogen and hence, a semiconductor device featuring high performance and high reliability can be provided.

In this embodiment, the lower interlayer insulating film as the first insulating layer is comprised of the BPSG film containing phosphorus and boron in concentration of not less than 3.0 wt %, respectively, but it should be appreciated that the material for forming the lower interlayer insulating film should not be limited to this embodiment. Even where the lower interlayer insulating film is formed of another material presenting a similar degree of reflow in the heat treatment, interposing the silicon oxide film between the silicon nitride film and the lower interlayer insulating film provides a similar effect to this embodiment such that the occurrence of wrinkle or cracks in the silicon nitride film is prevented.

In this embodiment, it is important to define a thickness of the silicon oxide film 5 such that no cracks or wrinkle may occur in the silicon nitride film 6. A suitable value thereof is dependent upon a concentration of impurities in the first BPSG film 3 or a reflow temperature thereof, a thickness of the silicon nitride film 6 and conditions of the heat treatment subsequent to the formation of the silicon nitride film 6. As the concentration of the impurities in the first BPSG film 3 and the temperature of the heat treatment subsequent to the formation of the silicon nitride film 6 are decreased, or in other words, as the conditions have decreased tendency to cause the reflow of the first BPSG film 3, the thickness of the silicon oxide film 5 may be reduced. Conversely, as the conditions have increased tendency to cause the reflow of the first BPSG film 3, the thickness of the silicon oxide film 5 must be increased. The greater the thickness of the silicon nitride film 6, the greater the stress produced in the silicon nitride film 6. Therefore, the silicon oxide film 5 is also required to have an increased thickness.

The thickness of the silicon nitride film 6 may be within a range such that the gate 2 or the polycide interconnection 4 at lower levels may not be oxidized during the heat treatment performed afterwards in the oxidation atmosphere.

According to this embodiment, although the supporting film interposed between the lower interlayer insulating film and the silicon nitride film is comprised of the silicon oxide film, it should be appreciated that the present invention is not limited to the above embodiment. That is, the supporting film of the invention may comprise any one of various films that functions to apply to the nitride film a resistant stress or a tensile stress against the shrinkage thereof. More specifically, the supporting film of the invention is preferably formed of such a material as has a similar thermal expansion coefficient and crystallographic structure to the BPSG film, applying to the nitride film a similar stress to the BPSG film.

According to this embodiment, the heat treatment subsequent to the formation of the silicon nitride film is performed at 850° C. in the oxidation atmosphere for 30 minutes. However, the effect of the invention can be attained by a heat treatment at a temperature lower than the above, provided that the conditions allow for the reflow of the lower interlayer insulating film. Incidentally, a heat treatment performed at higher temperatures provides a more conspicuous effect of the invention.

According to this embodiment, the first insulating film defines a first interlayer insulating film on the semiconductor substrate, but the invention should not be limited to this. The invention is generally applicable to semiconductor devices such as of a multi-level interconnection structure wherein the first insulating film may define a second or a third interlayer insulating film.

(Second Embodiment)

Figure 3:
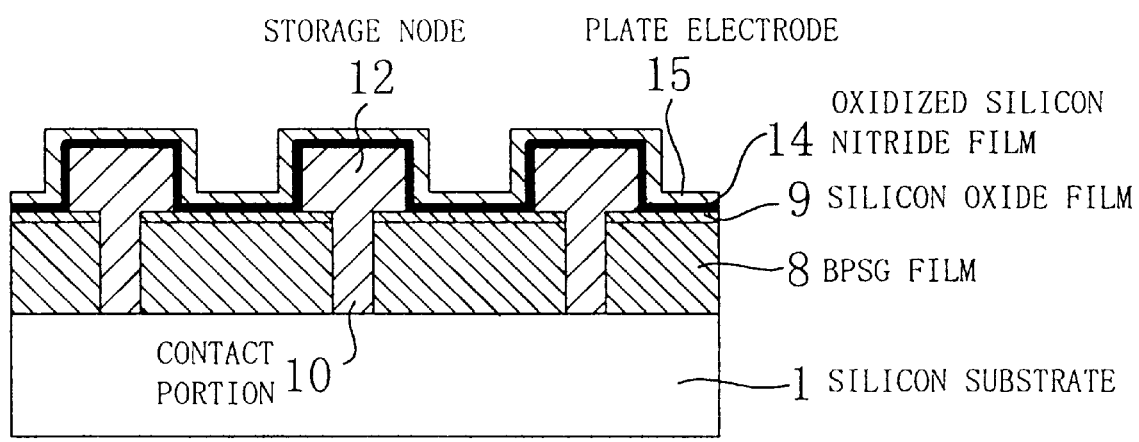
FIG. 3 is a sectional view showing a structure of a stacked DRAM cell in accordance with a second embodiment of the invention.

FIG. 3 is a sectional view showing a stacked DRAM cell as a semiconductor device in accordance with a second embodiment of the invention. In FIG. 3, the illustration of the gate, LOCOS isolation and bit line is omitted for clarification of a portion featuring this embodiment. This semiconductor device comprises the silicon substrate 1, a BPSG film 8 as the first insulating film reflowable by a heat treatment under predetermined conditions, a silicon oxide film 9 as the supporting film which is not caused to reflow by a heat treatment under the aforesaid predetermined conditions and applies a stress against the deformation of the nitride film, a storage node 12 including a contact portion 10 connected to an active region in the silicon substrate, an oxidized silicon nitride film 14 as the second insulating film serving as the capacitor insulating film, and a plate electrode 15.

Figure 4A:
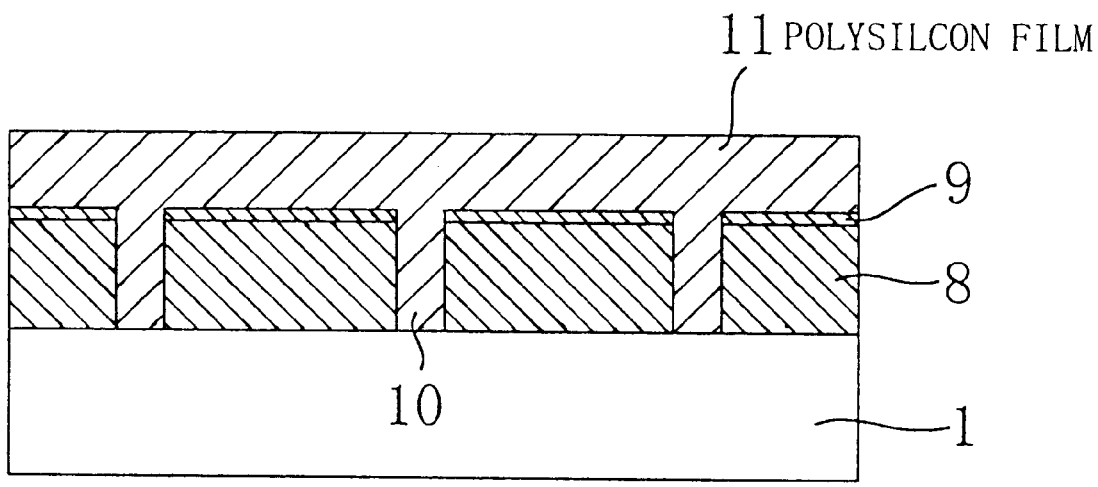
FIGS. 4A and 4B are sectional views for illustrating steps for fabricating the semiconductor device according to the second embodiment hereof.
Figure 4B:
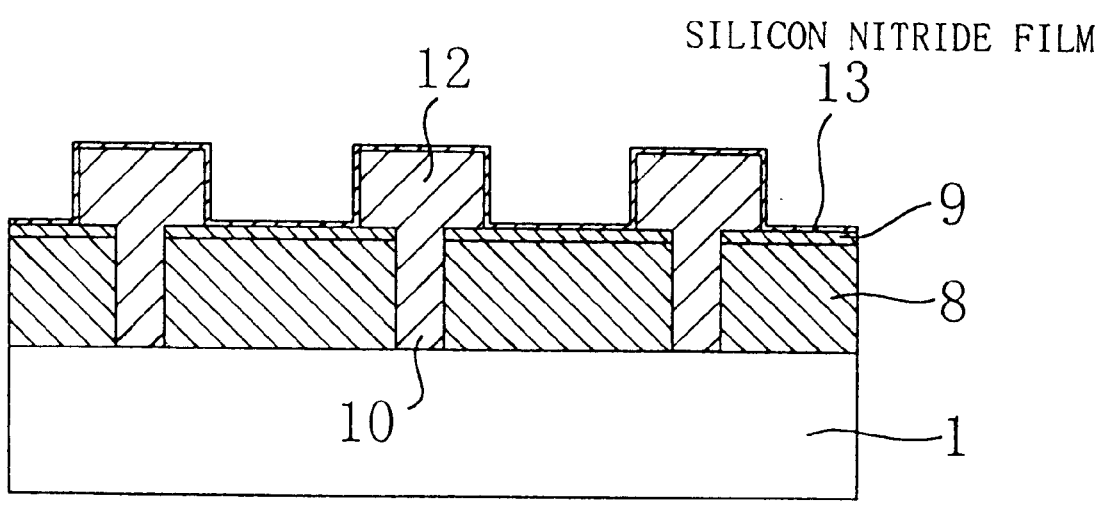

Now, a process for fabrication of the semiconductor device shown in FIG. 3 will be described with reference to FIGS. 4A and 4B. In FIGS. 4A and 4B, as well, the illustration of the gate, LOCOS isolation and bit line is omitted for clarification of a portion featuring the embodiment.

In a step shown in FIG. 4A, deposited on the silicon substrate 1 is the BPSG film 8 as the first insulating film reflowable by a heat treatment under the predetermined conditions. At this time, the BPSG film 8 contains therein phosphorus and boron as impurities in concentration of not less than 3.0 wt %, respectively. Subsequently, a heat treatment is performed for planarization of the BPSG film 8, which may be planarized by heat treating, for example, at 850° C. in an atmosphere of nitrogen for 30 minutes. Thereafter, deposited on the BPSG film 8 is the silicon oxide film 9 as the supporting film not reflowable by a heat treatment under the aforesaid predetermined conditions. Subsequent to opening a contact hole for storage node in the silicon oxide film 9 and the BPSG film 8, polysilicon is deposited on the substrate including the contact hole thereby forming the contact portion 10 and a polysilicon film 11 overlying the silicon oxide film 9. Normally, the polysilicon is added with N-type impurities.

In a step shown in FIG. 4B, the polysilicon film 11 is etched into a desired pattern thereby forming the storage node 12 integrated with the contact portion 10. Subsequently, the silicon nitride film 13 is deposited on the substrate in a thickness of about 8 nm.

The illustration of the subsequent steps are omitted. By oxidizing the aforesaid silicon nitride film 13, the oxidized silicon nitride film 14 shown in FIG. 3 is formed. The oxidation conditions at this time include, for example, a dry oxidation atmosphere, a temperature of 850° C. and a processing time of 30 minutes. Thereafter, normal processes are performed to form the plate electrode 15 shown in FIG. 3 and then to metallize in a desired pattern whereby the semiconductor device is completed. In general practice, there are further overlaid an upper interlayer insulating film defining the second or third interlayer insulating film having a thermally reflowable property.

According to this embodiment, the silicon oxide film 9 not reflowable by a heat treatment under the predetermined conditions and applying the stress against the deformation of the nitride film is interposed between the silicon nitride film 13 and the BPSG film 8, as shown in FIG. 4B, and therefore, even if the thermal oxidation of the silicon nitride film 13 for forming the oxidized silicon nitride film 14 causes the BPSG film 8 to reflow, the resultant oxidized silicon nitride film 14 does not suffer the occurrence of wrinkle or cracks.

In this embodiment, the lower interlayer insulating film as the first insulating film is comprised of the BPSG film containing phosphorus and boron in concentration of not less than 3.0 wt %, respectively, but it should be appreciated that a material for forming the lower interlayer insulating film is not limited to this. In case where the lower interlayer insulating film comprises another material presenting a similar degree of reflow in the heat treatment, as well, interposing the silicon oxide film between the silicon nitride film and the lower interlayer insulating film provides a similar effect to this embodiment such that the occurrence of wrinkle or cracks in the silicon nitride film is prevented.

In this embodiment, it is important to define a thickness of the silicon oxide film 9 such that no wrinkle or cracks may occur in the oxidized silicon nitride film 14. A suitable value thereof is dependent upon a concentration of impurities in the BPSG film 8, a thickness of the silicon nitride film 13 and conditions of the oxidation process subsequent to the formation of the silicon nitride film 13. As the concentration of the impurities in the BPSG film 8 and the temperature of the oxidation process subsequent to the formation of the silicon nitride film 13 are decreased, or in other words, as the conditions have decreased tendency to cause the reflow of the BPSG film 8, the thickness of the silicon oxide film 5 may be reduced. Conversely, as the conditions have increased tendency to cause the reflow of the BPSG film 8, the thickness of the silicon oxide film 9 must be increased. The greater the thickness of the silicon nitride film 13, the greater the stress produced in the silicon nitride film 13 and therefore, the silicon oxide film 9 is also required to have an increased thickness.

The thickness of the silicon nitride film 13 may be within a range such that the underlying storage node 12 may not be oxidized during the subsequent oxidation process.

Although in this embodiment, the supporting film interposed between the lower interlayer insulating film and the silicon nitride film is comprised of the silicon oxide film, the present invention should not be limited to this. The object of the invention may be achieved if the supporting film is formed of another material, provided that such a material is not caused to reflow by a heat treatment performed afterwards under the predetermined conditions and applies the stress against the deformation of the nitride film.

According to this embodiment, the silicon nitride film 13 is subject to the oxidation process at 850° C. in a pyrogenic atmosphere for 30 minutes. However, the effect of the invention may be attained by an oxidation process performed at lower temperatures than this embodiment, provided that the oxidation conditions are such that the lower interlayer insulating film reflows. Incidentally, an oxidation process at higher temperatures provides a more conspicuous effect of the invention.

(Third Embodiment)

Figure 5:
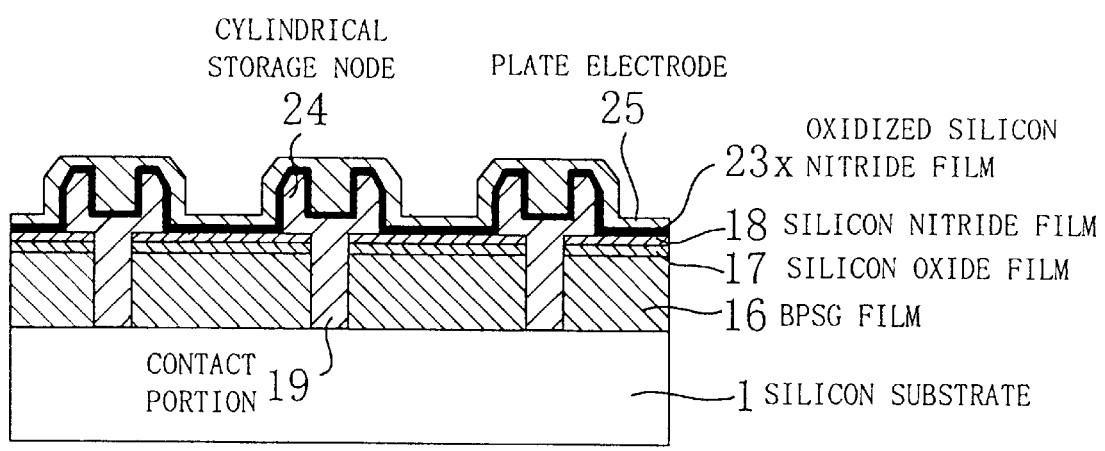
FIG. 5 is a sectional view showing a structure of a cylindrical stacked DRAM cell in accordance with a third embodiment of the invention.

FIG. 5 is a sectional view showing a cylindrical stacked DRAM cell as a semiconductor device according to a third embodiment of the invention. In FIG. 5, the illustration of the gate, LOCOS isolation and bit line is omitted for clarification of a portion featuring this embodiment. The semiconductor device comprises the silicon substrate 1, a BPSG film 16 as the first insulating film reflowable by a heat treatment under predetermined conditions, a silicon oxide film 17 not reflowable by a heat treatment under the aforesaid predetermined conditions, a silicon nitride film 18 serving as a wet etching stopper film in a process for fabricating a cylindrical stacked cell, a cylindrical storage node 24 including a contact portion 19 connected to an active region in the silicon substrate, an oxidized silicon nitride film 23x as the second insulating film functioning as the capacitor insulating film, and a plate electrode 25.

Now, a process for fabrication of the semiconductor device of FIG. 5 will be described with reference to FIGS. 6A to 6D. In FIGS. 6A to 6D, as well, the illustration of the gate, LOCOS isolation and bit line is omitted for clarification of a portion featuring this embodiment.

Figure 6A:
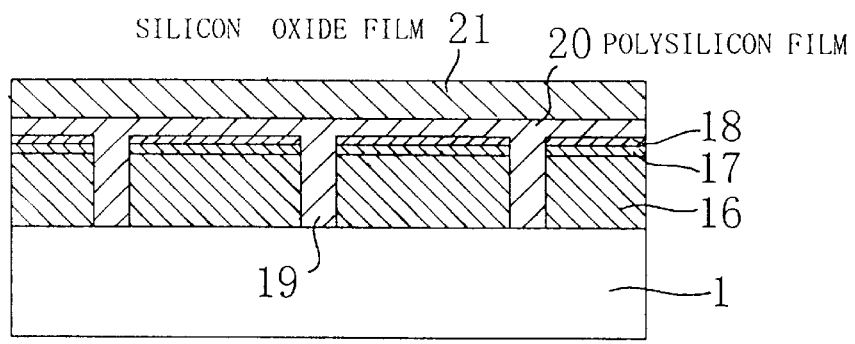
FIGS. 6A to 6D are sectional views for illustrating steps for fabricating the cylindrical stacked DRAM cell according to the third embodiment hereof.

In a step shown in FIG. 6A, deposited on the silicon substrate 1 is the BPSG film 16 as the first insulating film reflowable by a heat treatment under the predetermined conditions. At this time, the BPSG film 16 contains therein phosphorus and boron as impurities in concentration of not less than 3.0 wt %, respectively. Subsequently, a heat treatment is performed for planarizing the BPSG film 16, which may be planarized by heat treating, for example, at 850° C. in an atmosphere of nitrogen for 30 minutes. Thereafter, deposited on the BPSG film 16 is the silicon oxide film 17 as the supporting film not reflowable by a heat treatment under the predetermined conditions. Subsequently, there is formed the silicon nitride film 18 serving as the wet etching stopper in the formation of a cylindrical stacked cell. After opening a contact hole for storage node in the silicon nitride film 18, silicon oxide film 17 and BPSG film 16, polysilicon is deposited on the substrate including the contact hole so as to form the contact portion 19 and a polysilicon film 20 covering the silicon nitride film 18. Subsequently, a silicon oxide film 21 is laid over the polysilicon film 20.

Figure 6B:
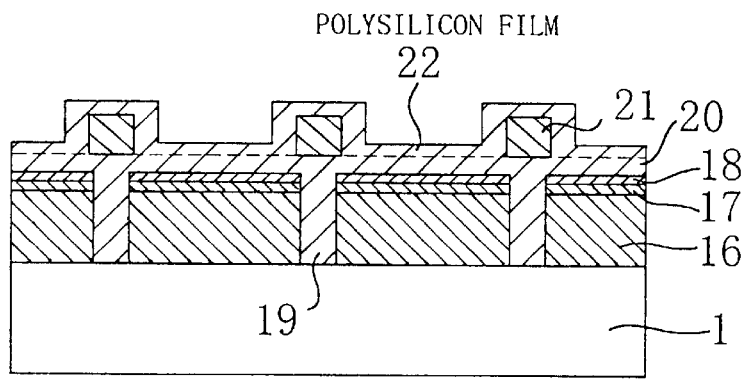

In a step shown in FIG. 6B, the silicon oxide film 21 is patterned into a desired cell configuration and then a polysilicon film 22 is deposited on the substrate. Prior to the deposition of the polysilicon film 22, native oxide formed on the polysilicon film 20 is removed.

Figure 6C:
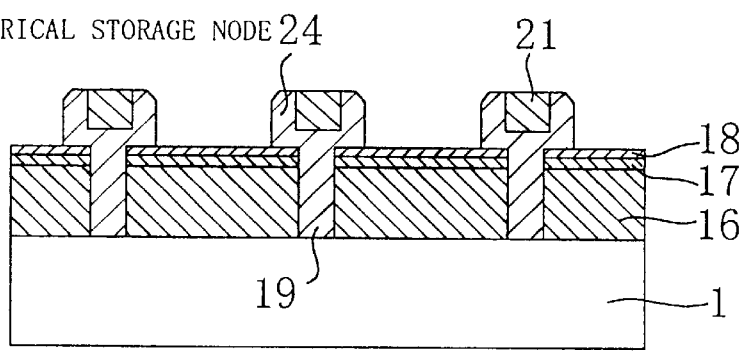

In a step shown in FIG. 6C, the polysilicon film 22 is subject to an anisotropic etching process such that the polysilicon film 22 is removed only except for a portion thereof on the side walls of the silicon oxide film 21 and thus is formed the cylindrical storage node 24 including the contact portion 19.

Figure 6D:
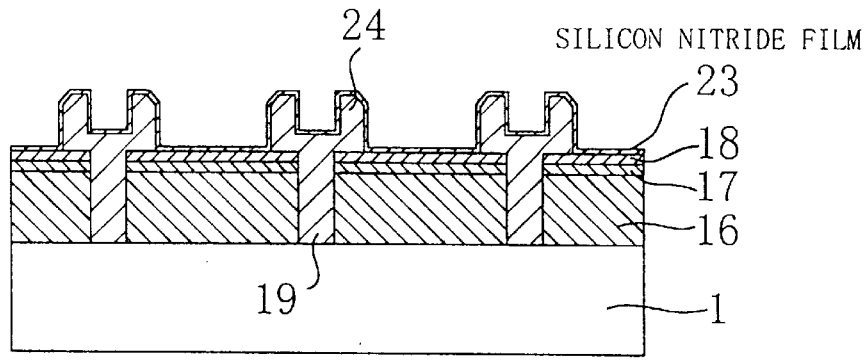

In a step shown in FIG. 6D, a wet etching process is performed by using the silicon nitride film 18 as the wet etching stopper thereby removing only the silicon oxide film 21. Subsequently, a silicon nitride film 23 is deposited on the substrate thereby covering therewith exposed surfaces of the silicon nitride film 18 and of the cylindrical storage node 24.

The illustration of the subsequent steps is omitted. By oxidizing the silicon nitride film 23, the oxidized silicon nitride film 23x of FIG. 5 is formed. Thereafter, normal processes are performed thereby forming the plate electrode 25 shown in FIG. 5 and then metallizing in a desired pattern whereby the semiconductor device is completed.

According to this embodiment, the silicon oxide film 17 not reflowable by a heat treatment under the predetermined conditions and applying the stress against the deformation of the nitride film is interposed between the silicon nitride film 18 and the BPSG film 16 and therefore, neither the silicon nitride film 18 nor the oxidized silicon nitride film 23x suffers the occurrence of cracks or wrinkle therein even if the BPSG film 16 reflows during the thermal oxidation of the silicon nitride film 23 for forming the oxidized silicon nitride film 23x.

In this embodiment, the lower interlayer insulating film as the first insulating film is comprised of the BPSG film containing phosphorus and boron in concentration of not smaller than 3 wt %, respectively, but it should be appreciated that a material for forming the lower interlayer insulating film is not limited to this. With a lower interlayer insulating film formed of another material presenting a similar degree of reflow in the heat treatment, interposing the silicon oxide film between the silicon nitride film and the lower interlayer insulating film provides a similar effect to this embodiment such that the occurrence of wrinkle or cracks in the silicon nitride film 18 and oxidized silicon nitride film 23s is prevented.

In this embodiment, it is important to define a thickness of the silicon oxide film 17 such that cracks or wrinkle may not occur in the silicon nitride film 18 or the oxidized silicon nitride film 23x. A suitable value thereof is dependent upon a concentration of the impurities in the BPSG film 16, a thickness of the silicon nitride film 18 and conditions of the oxidation process subsequent to the formation of the silicon nitride film 23. As the concentration of the impurities in the BPSG film 16 and the temperature of the oxidation process after the formation of the silicon nitride film 23 are decreased, or in other words, as the conditions have decreased tendency to cause the BPSG film 16 to reflow, the thickness of the silicon oxide film 17 may be reduced. Conversely, as the conditions have increased tendency to cause the BPSG film 16 to reflow, the thickness of the silicon oxide film 17 must be increased. Further, the greater the thicknesses of the silicon nitride film 18 and of the oxidized silicon nitride film 23x, the greater the stress produced in the silicon nitride film 18 and therefore, the thickness of the silicon oxide film 17 must be increased, as well.

The thickness of the silicon nitride film 18 may be in a range such that the underlying BPSG film 16 may not be attacked during the wet etch process performed afterwards.

In this embodiment, the supporting film interposed between the lower interlayer insulating film and the silicon nitride film is comprised of the silicon oxide film, but the present invention should not be limited to this. The object of the invention may be attained by the supporting film formed of another material, provided that such a material is not caused to reflow by a heat treatment performed afterwards under the predetermined conditions and applies the stress against the deformation of the nitride film.

Figure 7:
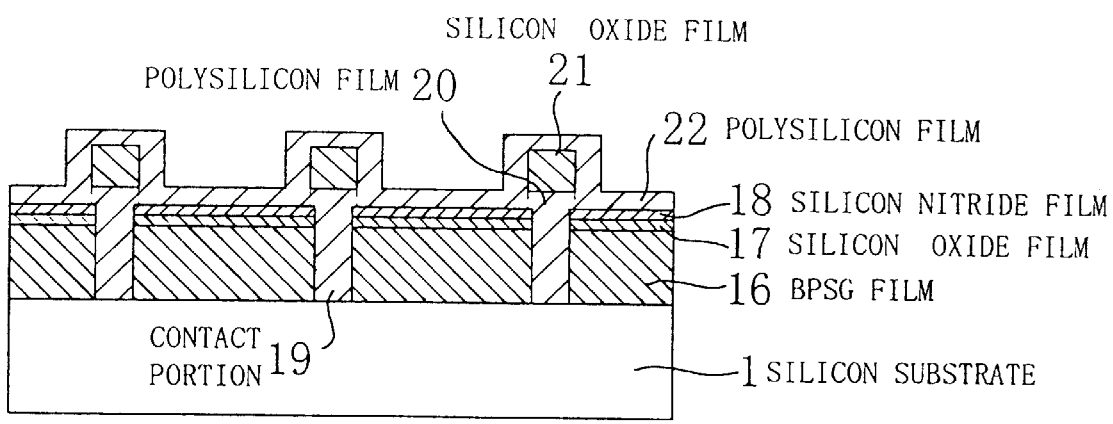
FIG. 7 is a sectional view for illustrating only one of the steps for fabricating a cylindrical stacked DRAM cell according to a first modification of the third embodiment hereof.

In the step shown in FIG. 6B wherein the silicon oxide film 21 is patterned into a desired cell configuration, a first modification of this embodiment may be adopted, comprising simultaneously etching the polysilicon film 20 along with the silicon oxide film, followed by depositing the polysilicon film 22 over the entire surface of the substrate, as shown in FIG. 7. Similarly to the above embodiment, this process is preferably preceded by the removal of the native oxide formed on the polysilicon film 20.

Further, a second modification of the embodiment may be adopted, wherein subsequent to the formation of the silicon nitride film 18 of FIG. 6B serving as the wet etching stopper, a silicon oxide film 27 is laid thereover. Next, with reference to FIGS. 8A to 8E, the second modification of the third embodiment will be described.

Figure 8A:
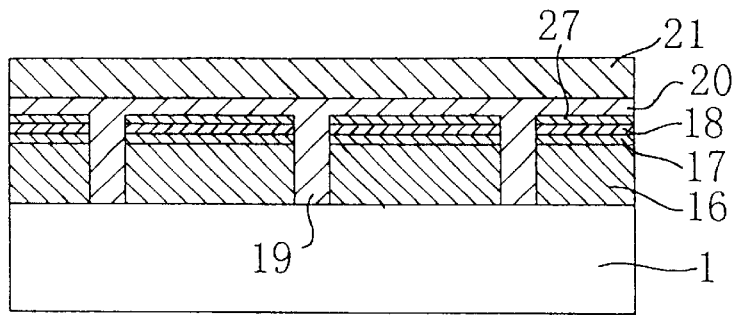
FIGS. 8A to 8E are sectional views for illustrating steps for fabricating a cylindrical stacked DRAM cell according to a second modification of the third embodiment hereof.

First, in a step shown in FIG. 8A, deposited on the silicon substrate 1 is the BPSG film 16 as the lower interlayer insulating film, which is then subject to a heat treatment for planarization thereof. Thereafter, the silicon oxide film 17 and the silicon nitride film 18 as the wet etching stopper are laid thereover in the order named. Subsequent to further laying the silicon oxide film 27 over the silicon nitride film 18, the contact hole for storage node is opened through the silicon oxide film 27, silicon nitride film 18, silicon oxide film 17 and BPSG film 16. Then, the polysilicon film is deposited on the substrate including the contact hole so as to form the contact portion 19 and the polysilicon film 20 over the silicon nitride film 27. Subsequently, the silicon oxide film 21 is deposited on the polysilicon film 20.

Figure 8B:
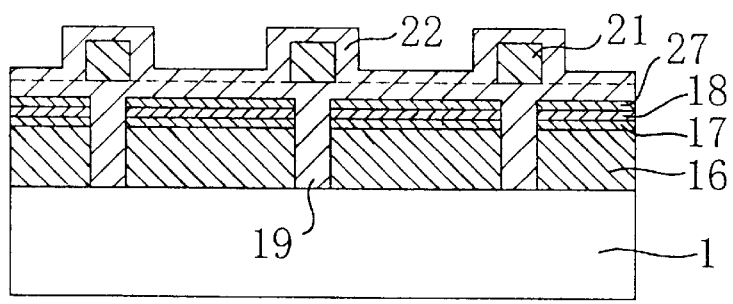

Similarly to the step of FIG. 6B, a step shown in FIG. 8B comprises patterning the silicon oxide film 21 into a desired cell configuration, followed by depositing the polysilicon film 22 on the substrate. Prior to the deposition of the polysilicon film 22, the native oxide formed on the polysilicon film 20 is removed.

Figure 8C:
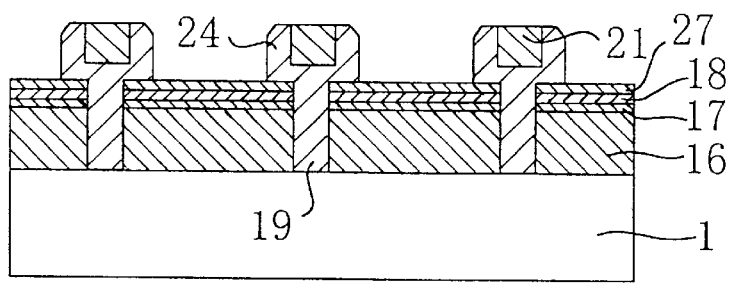

In a step shown in FIG. 8C, the polysilicon film 22 is subject to an anisotropic etching process such that the polysilicon film 22 is removed only except for a portion thereof on the side walls of the silicon oxide film 21 and thus is formed the cylindrical storage node 24 including the contact portion 19.

Figure 8D:
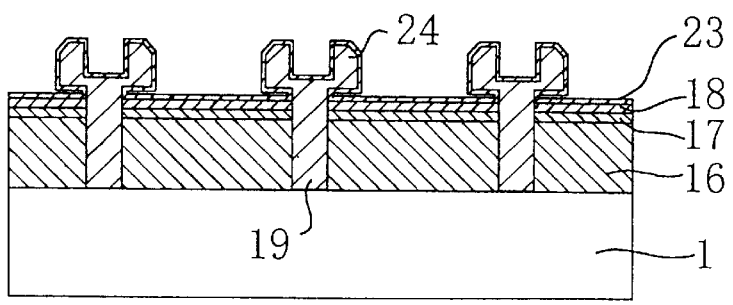

In a step shown in FIG. 8D, wet etching is performed by using the silicon nitride film 18 as the wet etching stopper thereby removing the silicon oxide films 21 and 27. In this state, a gap exists between a cylindrical portion of the cylindrical storage node 24 and the silicon nitride film 18. Subsequently, the silicon nitride film 23 is deposited on the substrate thereby covering therewith exposed surfaces of the silicon nitride film 18 and of the cylindrical storage node 24.

Figure 8E:
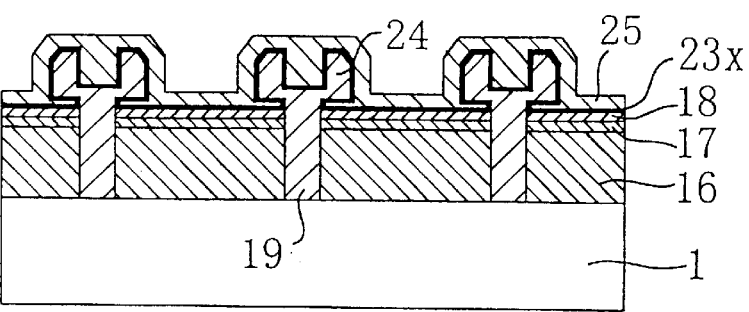

In a step shown in FIG. 8E, the silicon nitride film 23 is oxidized so as to form the oxidized silicon nitride film 23x. Thereafter, normal processes are performed thereby forming the plate electrode 25 and then metallizng in a desired pattern whereby the semiconductor device is completed.

In the case of the semiconductor device having a structure according to the modifications of the embodiment, the oxidized silicon nitride film 23x as the capacitor insulating film is formed for coverage over the surface of the cylindrical storage node 24 as well as that at the gap defined under a lower end of the cylindrical portion thereof. Thus, the area of the cell is increased thereby accordingly increasing the capacity of the cell.

(Fourth Embodiment)

Next, description will be made on a structure of a stacked DRAM cell in accordance with a fourth embodiment of the invention wherein the nitride film is laid only under the plate electrode.

Figure 9:
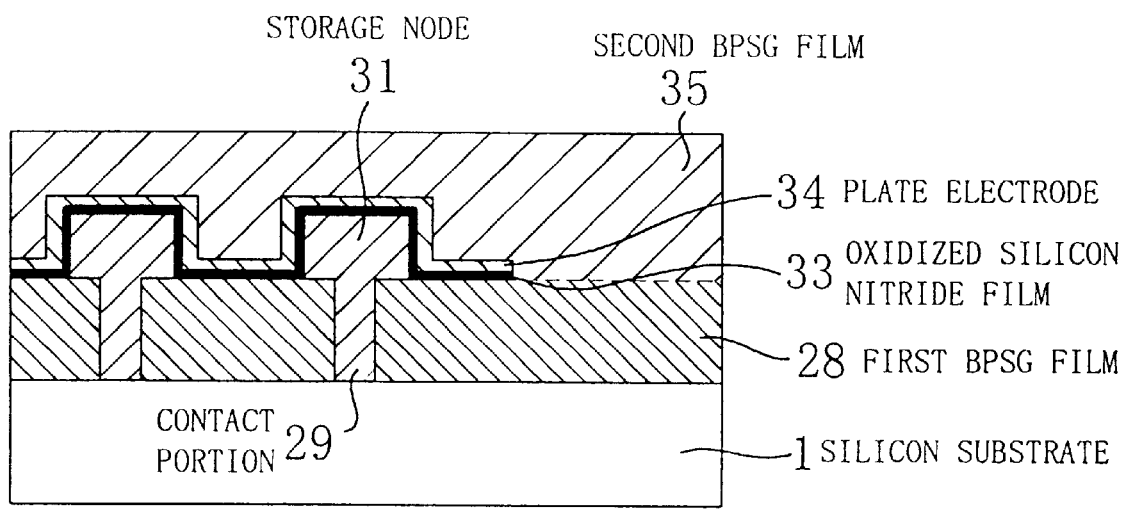
FIG. 9 is a sectional view showing a structure of a stacked DRAM cell in accordance with a fourth embodiment of the invention.

FIG. 9 is a sectional view showing a stacked DRAM cell as a semiconductor device according to the fourth embodiment of the invention. In FIG. 9, the illustration of the gate, LOCOS isolation and bit line is omitted for clarification of a portion featuring this embodiment. The semiconductor device comprises the silicon substrate 1, a first BPSG film 28 as the first insulating film reflowable by a heat treatment under predetermined conditions, a storage node 31 including a contact portion 29 connected to the active region in the substrate, an oxidized silicon nitride film 33 as the second insulating film functioning as the capacitor insulating film, a plate electrode 34, and a second BPSG film 35 as the third insulating film reflowable by a heat treatment under the predetermined conditions.

Next, a process for fabrication of the semiconductor device of FIG. 9 will be described with reference to FIGS. 10A and 10B. It is to be noted here that in FIGS. 10A and 10B, the illustration of the gate, LOCOS isolation and bit line is omitted for clarification of a portion featuring this embodiment.

Figure 10A:
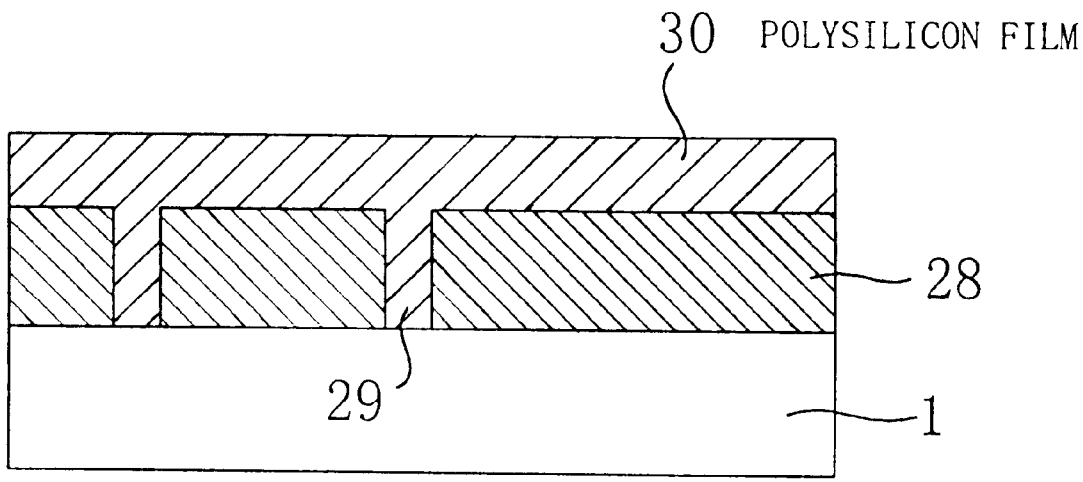
FIGS. 10A and 10B are sectional views for illustrating steps for fabricating the stacked DRAM cell according to the fourth embodiment hereof.

In a step shown in FIG. 10A, deposited on the silicon substrate 1 is the first BPSG film 28 as the first insulating film reflowable by a heat treatment under the predetermined conditions. At this time, the BPSG film 28 contains therein not more than 5.0 wt % of phosphorus and not more than 6.0 wt % of boron, as impurities. Subsequently, a heat treatment is performed for planarizing the first BPSG film 28, which may be planarized by heat treating, for example, at 850° C. in an atmosphere of nitrogen for 30 minutes. After opening a contact hole for storage node, polysilicon is deposited on the substrate including the contact hole thereby forming the contact portion 29 filling the contact hole and the polysilicon film 30 over the first BPSG film 28. The polysilicon is normally added with N-type impurities.

Figure 10B:
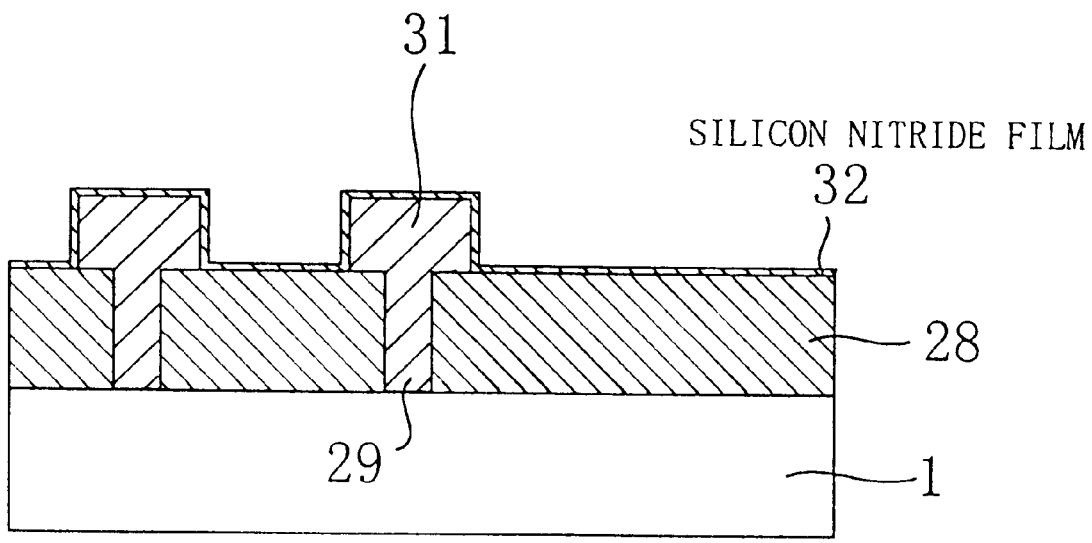

In a step shown in FIG. 10B, the polysilicon film 30 is etched into a desired pattern thereby to form the storage node 31 including the contact portion 29. Subsequently, a silicon nitride film 32 is deposited on the substrate in a thickness of about 8 nm.

The illustration of the subsequent steps are omitted. The silicon nitride film 32 is oxidized for forming the oxidized silicon nitride film 33 shown in FIG. 9. At this time, the oxidation conditions include, for example, a dry oxidation atmosphere, a temperature of 850° C. and a processing time of 30 minutes. Thereafter, a polysilicon film is laid over the substrate and etched into a desired pattern thereby to form the plate electrode 34. Concurrently with the etching of the plate electrode 34, the underlying oxidized silicon nitride film 33 is removed at a portion corresponding to the removed portion of the plate electrode 34. Subsequently, deposited is the second BPSG film 35 as the third insulating film which is reflowable by a heat treatment under the predetermined conditions. The second BPSG film 35 is planarized by heat treating, for example, at 850° C. in the atmosphere of nitrogen for 30 minutes. Subsequently, the semiconductor device is completed by metallizing in a desired pattern.

According to the semiconductor device of this embodiment, when the heat treatment is performed for planarizing the second BPSG film 35, the oxidized silicon nitride film 33 does not exist except for a region underlying the plate electrode 34. That is, the top surface of the oxidized silicon nitride film 33 is covered with the plate electrode 34 formed of the polysilicon film. Accordingly, despite the reflow of the lower interlayer insulating film during the process for planarizing the upper interlayer insulating film, the stress against the deformation of the oxidized silicon nitride film 33 is applied thereto by the plate electrode 34 and therefore, the oxidized silicon nitride film 35 does not suffer the occurrence of wrinkle or cracks therein.

When the supporting film is laid over or under the nitride film, the supporting film should be laid in such a manner as to cover at least a region including a formation region of the nitride film with respect to a common projection plane, or in other words, the supporting film should be so formed as to have the same two-dimensional shape as the nitride film or to provide a greater coverage than the nitride film. This ensures the prevention of occurrence of wrinkle or cracks in the nitride film during a heat treatment under the predetermined conditions.

Further according to this embodiment, when the silicon nitride film 32 is thermally oxidized to form the oxidized silicon nitride film 33, the plate electrode 34 is yet to exist and the silicon oxide film 9 such as provided in the second embodiment is not laid under the silicon nitride film 33. However, there occurs no wrinkle or cracks in the silicon nitride film 32 during this oxidation process because, unlike the second embodiment, the first BPSG film 28 contains the impurities in low concentration and the oxidation of the silicon nitride film 32 is performed at a relatively low temperature. The experiment conducted by the inventors demonstrates that if the first BPSG film 28 contains not more than 5.0 wt % of phosphorus and not more than 6.0 wt % of boron as the impurities, the dry oxidation of the silicon nitride film 32 can be accomplished at lower temperatures than the heat treatment for planarizing the first BPSG film 28 while preventing the occurrence of wrinkle or cracks in the silicon nitride film 32. It is to be noted that since the first BPSG film 28 contains the impurities in low concentration, the first BPSG film thus heat treated for planarization thereof presents a slightly lower flatness than that of the second embodiment.

Figure 11:
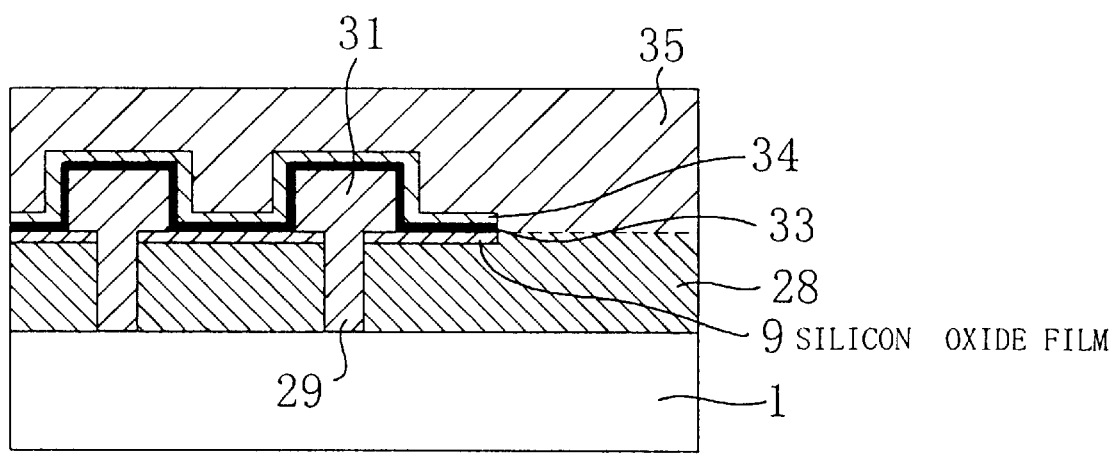
FIG. 11 is a sectional view showing a structure of a stacked DRAM cell according to a modification of the fourth embodiment hereof.

FIG. 11 is a sectional view showing a structure of a semiconductor device according to a modification directed to avoid the above drawback. According to this modification, the first BPSG film 28 contains the impurities in high concentration such that the film may be improved in flatness. Additionally, interposed between the first BPSG film 28 and the oxidized silicon nitride film 33 is the same silicon oxide film 9 with the second embodiment hereof that serves as the supporting film not reflowable by a heat treatment under the predetermined conditions. The presence of the silicon oxide film 9 is effective to prevent the occurrence of cracks or wrinkle in the silicon nitride film 32 even if the silicon nitride film 32 in the state shown in FIG. 10B is subject to the oxidation process. Incidentally, the semiconductor device of FIG. 11 has the same structure with the semiconductor device of FIG. 9 except for that the silicon oxide film 9 is provided.

As to the oxidation conditions for the silicon nitride film 32 affecting the reflow of the first BPSG film 28, the experiment demonstrates that the dry oxidation process presents a smaller tendency to produce reflow of the film than the pyrogenic oxidation process. It seems that this is because vapor penetrating the silicon nitride film 32 in the pyrogenic oxidation process presents a greater tendency to develop the reflow of the first BPSG film 28 than dry oxygen penetrating the silicon nitride film 32 in the dry oxidation process.

As to how the method of depositing the silicon nitride film 32 affects the resultant silicon nitride film, it is confirmed that more positive prevention of the occurrence of cracks or wrinkle is provided by subjecting the base to heat treatment (preprocess) in an atmosphere of nitrogen or ammonia prior to the deposition process. It seems that the preprocess performed in the atmosphere of nitrogen or ammonia provides a greater thickness of the resultant silicon nitride film 32 on the first BPSG film 28 than where the preprocess is not performed and therefore, the thicker silicon nitride film 32 reduces the amount of oxygen penetrating therethrough, resulting in harder reflow of the first BPSG film 28. The reason why the thickness of the silicon nitride film varies depending upon whether the preprocess is performed or not is because difference in the state of the base varies the initiation of deposition process. The silicon nitride deposition on the BPSG film subject to no preprocessing presents a slower initiation of deposition than the silicon nitride deposition on the BPSG film preprocessed in the atmosphere of nitrogen.

(Fifth Embodiment)

Next, description will be made on a fifth embodiment of the invention wherein the DRAM cell structure of the fourth embodiment with the nitride film provided only beneath the plate electrode is applied to the cylindrical stacked DRAM cell structure.

Figure 12:
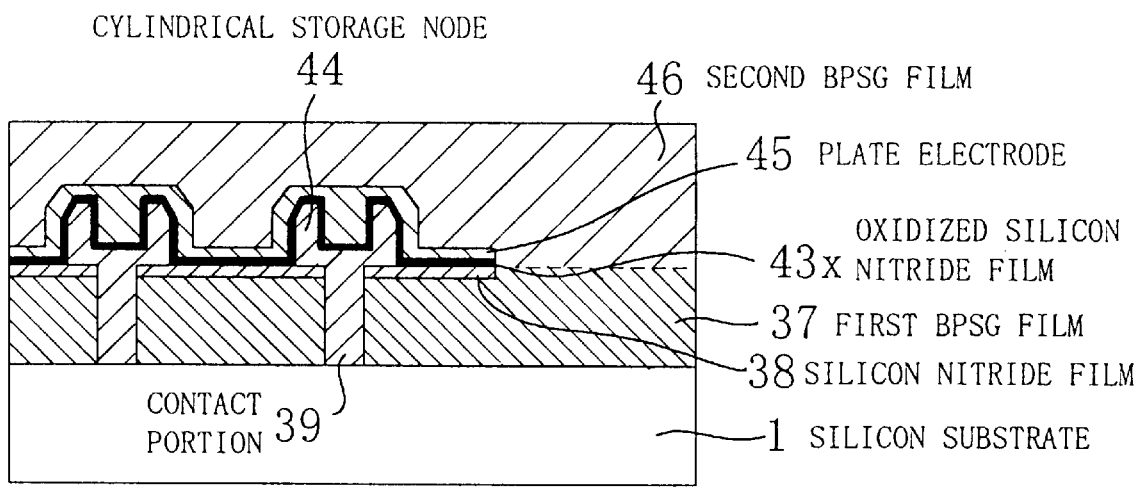
FIG. 12 is a sectional view showing a structure of a cylindrical stacked DRAM cell in accordance with a fifth embodiment of the invention.

FIG. 12 is a sectional view showing a cylindrical stacked DRAM cell as a semiconductor device according to the fifth embodiment of the invention. In FIG. 12, the illustration of the gate, LOCOS isolation and bit line is omitted for clarification of a portion featuring this embodiment. The semiconductor device comprises the silicon substrate 1, a first BPSG film 37 as the first insulating film reflowable by a heat treatment under predetermined conditions, a silicon nitride film 38 serving as the wet etching stopper, a cylindrical storage node 44 including a contact portion 39 connected to the active region in the silicon substrate, an oxidized silicon nitride film 43x as the second insulating film serving as the capacitor insulating film, a plate electrode 45 also serving as the supporting film, and a second BPSG film 46 as the third insulating film reflowable by a heat treatment under the predetermined conditions.

Now, a process for fabrication of the semiconductor device shown in FIG. 12 will be described with reference to FIGS. 13A to 13D. It is to be noted here that FIGS. 13A to 13D omit the illustration of the gate, LOCOS isolation and bit line for clarification of the portion featuring this embodiment.

Figure 13A:
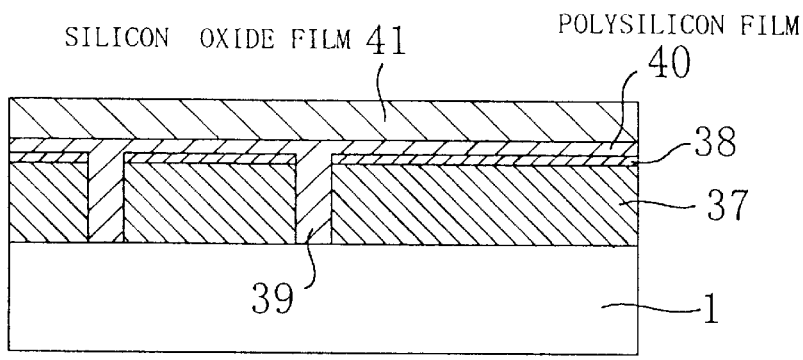
FIGS. 13A to 13D are sectional views for illustrating steps for fabricating the cylindrical stacked DRAM cell according to the fifth embodiment hereof.

First in a step shown in FIG. 13A, deposited on the silicon substrate 1 is the first BPSG film 37 as the first insulating film reflowable by a heat treatment under the predetermined conditions. At this time, the first BPSG film 37 contains therein not more than 5.0 wt % of phosphorus and not more than 6.0 wt % of boron as impurities. Subsequently, the first BPSG film 37 is subject to a heat treatment for planarization thereof. The first BPSG film 37 may be planarized by heat treating, for example, at 850° C. in an atmosphere of nitrogen for 30 minutes. Next, the silicon nitride film 38 is formed, which serves as the wet etching stopper during the formation of the cylindrical stacked cell. After opening a contact hole in the silicon nitride film 38 and the first BPSG film 37, polysilicon is deposited on the substrate including the contact hole thereby forming the contact portion 39 and a polysilicon film 40 over the silicon nitride film 38. Subsequently, a silicon oxide film 41 is laid over the polysilicon film 40.

Figure 13B:
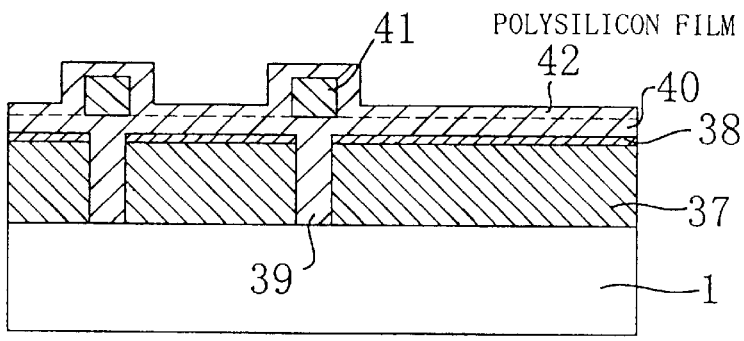

In a step shown in FIG. 13B, the silicon oxide film 41 is patterned into a desired cell configuration and then, a polysilicon film 42 is deposited on the substrate. Incidentally, the native oxide formed on the polysilicon film 40 is removed prior to the deposition of the polysilicon film 42.

Figure 13C:
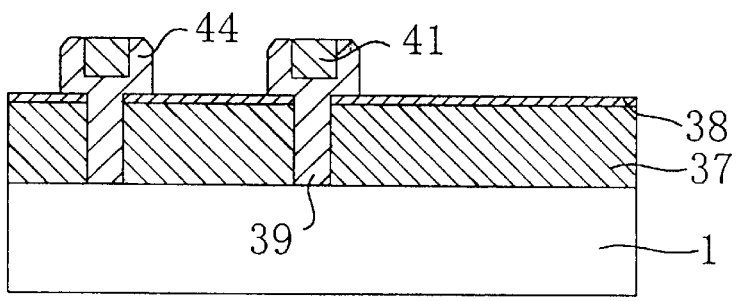

In a step shown in FIG. 13C, the polysilicon film 42 is subject to the anisotropic etching such that the polysilicon film 22 is removed only except for a portion thereof on the side walls of the silicon oxide film 41 and thus is formed the cylindrical storage node 44 including the contact portion 39.

Figure 13D:
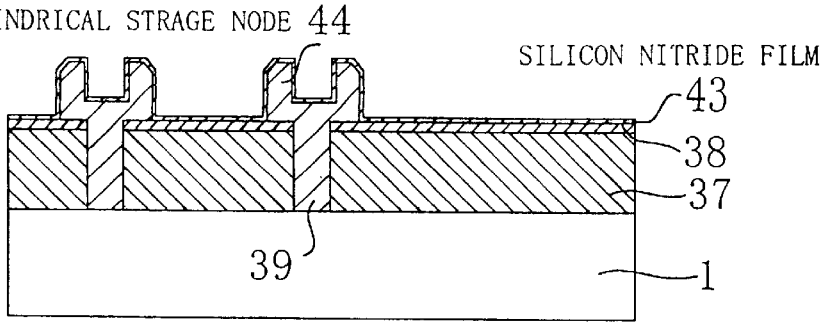

In a step shown in FIG. 13D, a wet etching process is performed by using the silicon nitride film 38 as the wet etching stopper, thereby removing only the silicon oxide film 41 defining a cylinder core. Subsequently, a silicon nitride film 43 is deposited on the substrate in a thickness of about 8 nm thereby covering exposed surfaces of the silicon nitride film 38 and the cylindrical storage node 44 therewith.

The illustration of the subsequent steps is omitted. The oxidized silicon nitride film 43x shown in FIG. 12 is formed by oxidizing the silicon nitride film 43. The oxidation conditions therefor include, for example, a pyrogenic atmosphere, a temperature of 800° C. and a processing time of 30 minutes. Subsequently, a polysilicon film is deposited on the substrate and etched into a desired pattern thereby to form the plate electrode shown in FIG. 12. Concurrently with the etching of the plate electrode 45, the underlying oxidized silicon nitride film 43x and the silicon nitride film 38 as the wet etching stopper are removed at a region except for a region corresponding to the plate electrode 45. Thereafter, the second BPSG film 46 as the third insulating film shown in FIG. 12 is deposited and then planarized by heat treatment which is performed, for example, at 850° C. in the atmosphere of nitrogen for 30 minutes. The semiconductor device is completed by metallizing in a desired pattern.

According to the semiconductor device of this embodiment, similarly to the fourth embodiment of the invention, the heat treatment for planarization of the second BPSG film 46 does not result in the occurrence of wrinkle or cracks in the silicon nitride film 38 nor the oxidized silicon nitride film 43x because the oxidized silicon nitride film 43s and the silicon nitride film 38 as the wet etching stopper are absent in the region except for that lying under the plate electrode 45.

In this embodiment, when the silicon nitride film 43 is thermally oxidized to form the oxidized silicon nitride film 43x, the plate electrode 45 is yet to exist and the silicon oxide film 17 such as provided in the third embodiment is not provided under the silicon nitride film 43 nor the silicon nitride film 38. However, this oxidation process does not entail the occurrence of wrinkle or cracks in the silicon nitride film 38 nor in the oxidized silicon nitride film 43x. This is because unlike the aforementioned third embodiment, the first BPSG film 37 contains the impurities in low concentration and the thermal oxidation of the silicon nitride film 43 is performed at a relatively low temperature. Detailed description will hereinbelow be made on such conditions as to prevent the reflow of the BPSG film during the thermal oxidation process.

The incidence of wrinkle in silicon nitride films was examined by thermally oxidizing the silicon nitride films with varied concentrations of phosphorus and boron contained in the BPSG film and varied thermal oxidation temperatures. The results are shown in the following table wherein a mark ○ denotes a condition to produce no wrinkle, x denotes a condition to produce wrinkle and Δ denotes a critical condition for wrinkle production.

| Oxidation Temp. | Phosphorus Conc. | Boron Conc. | wrinkle |
|---|---|---|---|
| 850° C. | 5.5 wt % | 5.0 wt % | x |
| 820° C. | 5.5 wt % | 5.0 wt % | x |
| 800° C. | 5.5 wt % | 5.0 wt % | Δ |
| 850° C. | 5.5 wt % | 3.8 wt % | x |
| 820° C. | 5.5 wt % | 3.8 wt % | Δ |
| 800° C. | 5.5 wt % | 3.8 wt % | ○ |

According to the above experiment, all the ref lows of the BPSG films occur at a temperature of 850° C.

With decrease in the concentration of phosphorus and boron, the BPSG film presents a lower degree of reflow and hence, the flatness thereof is lowered. In order to accomplish the reflow of the film by means of the heat treatment at 850° C., the lowest limit for the concentration of the impurities is 5.5 wt % for phosphorus and 3.8 wt % for boron. Further reduction of the concentrations of these elements is believed to be impracticable. With this composition of the film, the heat treatment at 820° C. entails no occurrence of wrinkle.

As is appreciated from the above, if the BPSG film has a reflow temperatures of not less than 830° C. (850° C., for example), a thermal oxidation process at a temperature of not more than 820° C. (850° C., for example) can thermally oxidize the silicon nitride film without causing the BPSG film to reflow. Accordingly, the deformation of the silicon nitride film during the thermal oxidation process can be prevented without the supporting film.

It is to be noted that by adjusting the concentrations of phosphorus and boron such that the phosphorus concentration is in the range of between 2.0 and 6.0 wt % and the boron concentration is in the range of between 1.0 and 4.0 wt %, the effect of the invention may be accomplished to some extent.

Such a method is suitably applied to the fabrication of a DRAM cell wherein the plate electrode defines the supporting film so as to exclude the need for providing an additional supporting film comprised of the silicon oxide film. This method is also applicable to the fourth embodiment hereof shown in FIG. 9.

Incidentally, where for the purpose of improving the flatness of the first BPSG film 37, for example, the thermal oxidation of the silicon nitride film 43 must be performed under such conditions as to cause the reflow of the first BPSG film 37, a silicon oxide film may be laid under the silicon nitride film 38.

Figure 14:
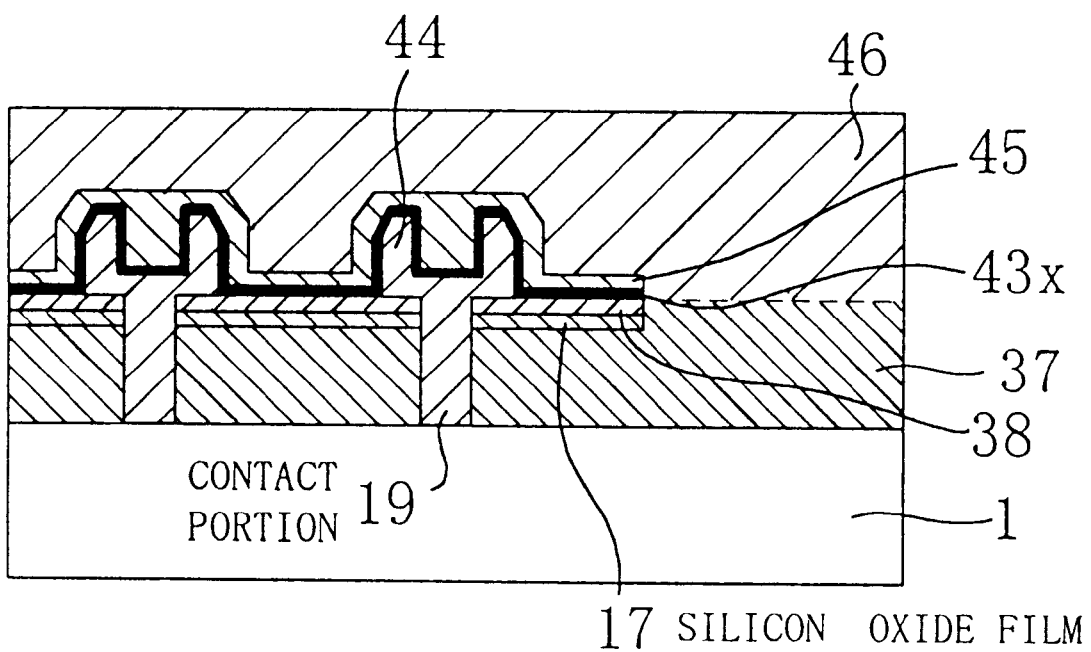
FIG. 14 is a sectional view showing a structure of a cylindrical stacked DRAM cell according to a modification of the fifth embodiment hereof.

FIG. 14 is a sectional view showing a structure of a semiconductor device according to such a modification of the embodiment. According to this modification, the first BPSG film 37 contains the impurities in higher concentration for improvement of the flatness thereof while interposed between the first BPSG film 37 and the silicon nitride film 38 is the same silicon oxide film 17 as in the third embodiment, the film serving as the supporting film not reflowable by a heat treatment under the predetermined conditions. The presence of this silicon oxide film 17 is effective to prevent the occurrence of cracks or wrinkle in the silicon nitride film 38 and the oxidized silicon nitride film 43x even if the oxidation of the silicon nitride film 43 is performed in the state shown in FIG. 13D. Incidentally, the semiconductor device of FIG. 14 has the same structure as the aforementioned semiconductor device of in FIG. 12 except for that the silicon oxide film 17 is provided. According to this modification, the addition of the silicon oxide film 17 provides a more stable fabrication process.

(Modifications of the Foregoing Embodiments)

In the foregoing embodiments pertaining the cylindrical stacked DRAM cells, all the etching stopper films are comprised of the silicon nitride film but the present invention should not be limited to these embodiments. A TEOS film, an silicon oxide film formed by thermal decomposition of tetraethyloxysilane (TEOS) can also present a high etching selectivity to a polysilicon film or a typical silicon oxide film. Accordingly, the silicon nitride films 18 and 38 shown in FIGS. 5, 7, 12 and 14, for example, may be replaced by the TEOS film. It is noted that where the TEOS film is used as the etching stopper film, a film defining the core of the cylindrical storage node (the film 21 shown in FIG. 6A) is comprised of the BPSG film. In this case, the additional supporting film is not required because the TEOS film functions as the supporting film, or to prevent the deformation of the capacitor insulating film.

In the foregoing second to fifth embodiments, if a film having a high etching selectivity to the oxide film is first deposited on the substrate and then the contact hole is opened, the etched contact hole is prevented from increasing in size.

Figure 15A:
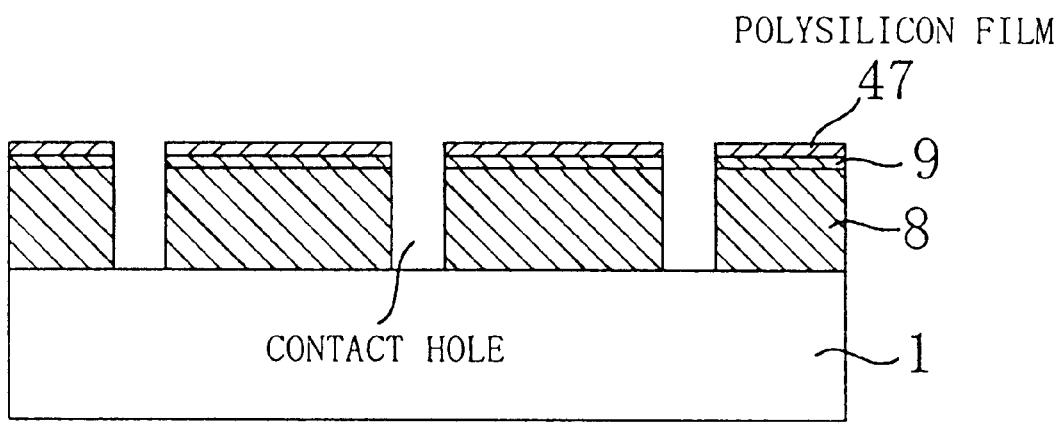
FIGS. 15A and 15B are sectional views for illustrating a modification of another embodiment of the invention directed to the prevention of a size increase of a contact hole.
Figure 15B:
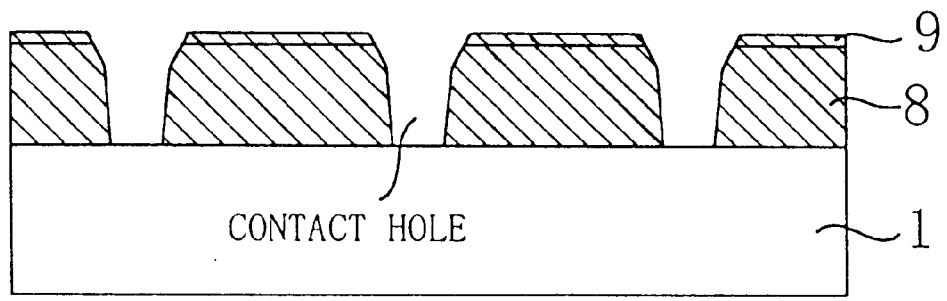
Figure 16:
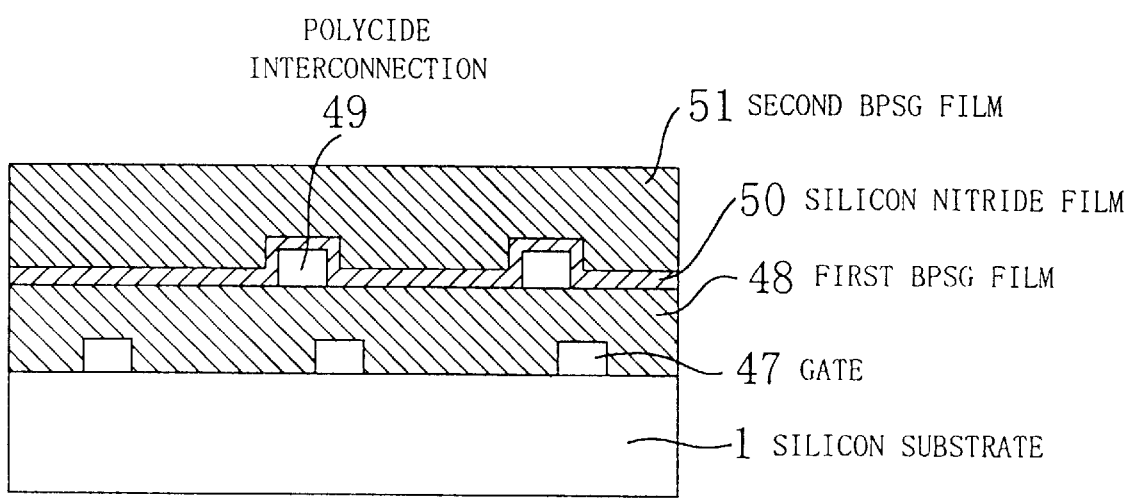
FIG. 16 is a sectional view showing a structure of a prior-art semiconductor device having a polycide interconnection.
Figure 17:
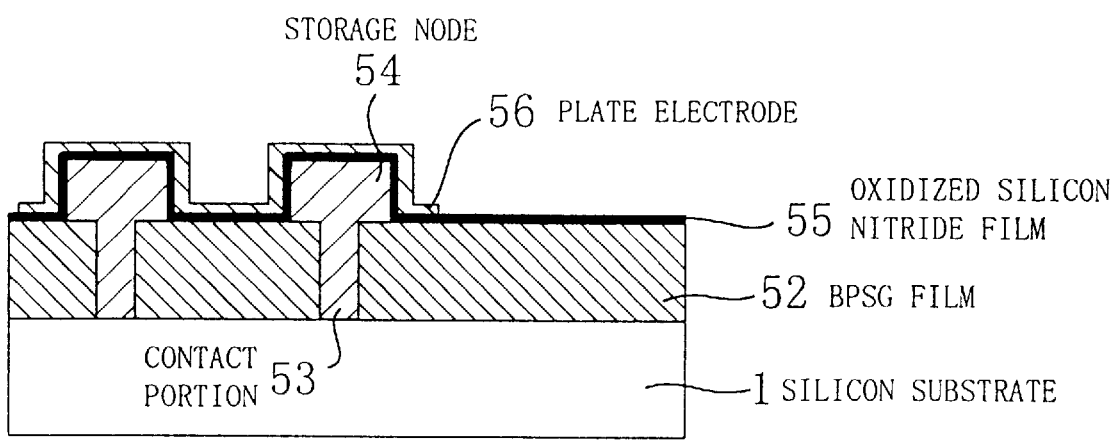
FIG. 17 is a sectional view showing a structure of a prior-art stacked DRAM cell.
Figure 18:
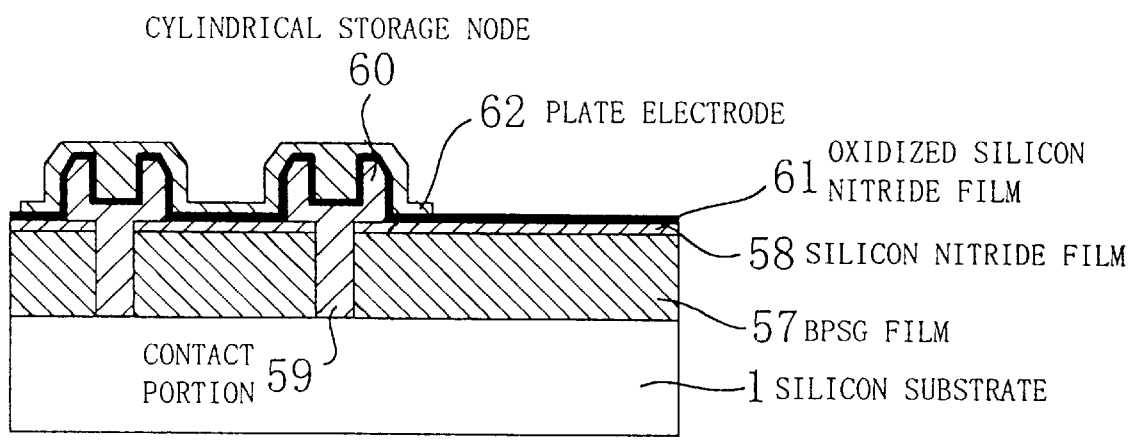
FIG. 18 is a sectional view showing a structure of a cylindrical stacked DRAM cell known to the art.
Figure 19A:
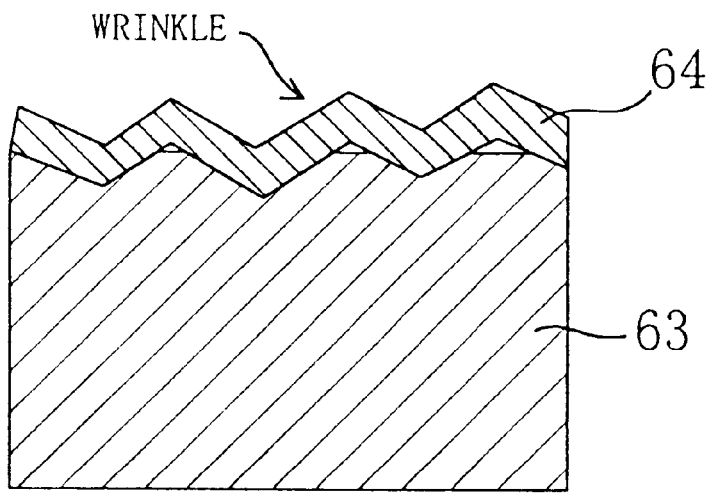
FIGS. 19A and 19B are sectional views each illustrating a state in which wrinkle or crack is produced in the silicon nitride film of the prior-art semiconductor device.
Figure 19B:
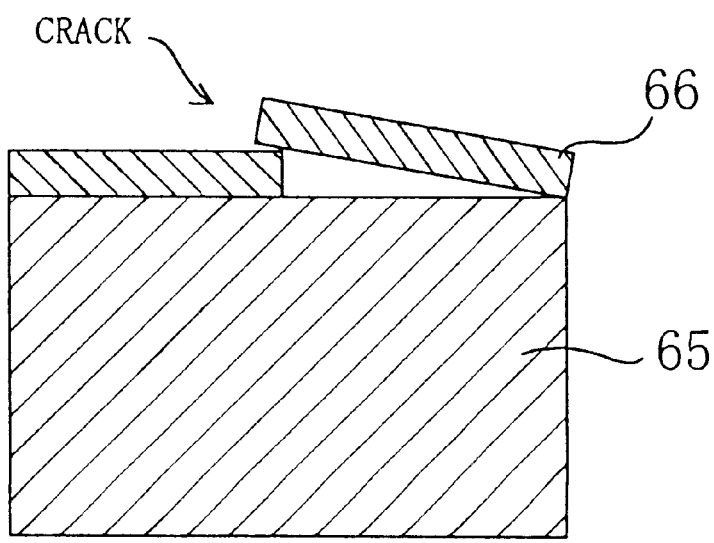

FIGS. 15A and 15B illustrate the step to form the contact hole in the fabrication process according to the second embodiment, showing difference in the shape of the contact hole between a case where a polysilicon film 47 as an edge retaining film having a high etching selectivity to the oxide film is provided and a case where no polysilicon film is provided (second embodiment). As seen in FIG. 15A, where the polysilicon film 47 having a high etching selectivity to the oxide film is laid over the silicon oxide film 9, the presence of the polysilicon film 47 is effective to prevent the expansion of an upper portion of the contact hole, as shown in FIG. 15B, regardless of variations of the etching conditions.

In the foregoing embodiments, the first insulating film having the property of reflowing due to a heat treatment under the predetermined conditions is comprised of the BPSG film, but the present invention should not be limited to these embodiments. Obviously, the invention is applicable to insulating films such as added with arsenic instead of phosphorus, and as further added with fluorine for imparting a property of reflowing due to a heat treatment at further reduced temperatures.

According to the foregoing embodiments, the supporting film is interposed between the lower interlayer insulating film as the first insulating film and the silicon nitride film, but the present invention should not be limited to these embodiments. For example, with the supporting film such as of the silicon oxide film or the like interposed between the silicon nitride film and the upper interlayer insulating film, the process for planarizing the upper interlayer insulating film or the like ensures the prevention of occurrence of wrinkle or cracks in the silicon nitride film.

According to the above embodiments pertaining the DRAM cells, all the first insulating films define a so-called first interlayer insulating film directly laid over the substrate, but the present invention should not be limited to these embodiments. In some type of the DRAM cells, the storage node may be formed on the second interlayer insulating film or on an interlayer insulating film at a further upper level. In such a case, the first insulating film denotes an interlayer insulating film immediately under the storage node or all the interlayer insulating films thereunder.

What is claimed is:

1. A process for fabrication of a semiconductor device functioning as a stacked DRAM cell comprising the steps of:

a first step to deposit a first insulating film on a semiconductor substrate having an impurity diffusion layer, the first insulating film having a property of ref lowing due to a heat treatment under predetermined conditions;

a second step to perform a first heat treatment under said predetermined conditions thereby causing said first insulating film to reflow for planarization thereof;

a third step following said second step so as to form a supporting film having a property of not reflowing due to a heat treatment under said predetermined conditions;

a fourth step to form a contact hole extending through said supporting film and said first insulating film and to said impurity diffusion layer;

a fifth step to deposit a first conductive film for storage node on the substrate including said contact hole;

a sixth step to pattern said first conductive film for storage node for forming a storage node connected to said impurity diffusion layer;

a seventh step following said sixth step so as to deposit a second insulating film comprising a silicon nitride film for coverage over a surface of said storage node and an exposed surface of said supporting film;

an eighth step following said seventh step so as to perform a second heat treatment under said predetermined conditions thereby oxidizing a surface of said second insulating film for formation of a capacitor insulating film comprising an oxidized silicon nitride film; and a ninth step following said eighth step so as to form a conductive film for plate electrode on the substrate;

wherein in said eighth step, a stress against deformation of said second insulating film caused by said second heat treatment is applied thereto by said supporting film.

2. A process for fabrication of a semiconductor device as set forth in claim 1, further including:

a step following said ninth step so as to form a third insulating film on the substrate, the third insulating film having a property of ref lowing due to a heat treatment under said predetermined conditions; and a step following the above step so as to perform a third heat treatment under said predetermined conditions thereby causing said third insulating film to reflow for planarization thereof;

wherein in said planarization step, a stress against deformation of said second insulating film caused by said third heat treatment is applied thereto by said supporting film.

3. A process for fabrication of a semiconductor device as set forth in claim 1, wherein in said third step, the supporting film is formed of a TEOS film;

said process further including a step conducted after said fifth step and prior to said sixth step so as to form a core of cylindrical storage node on said first conductive film for storage node, the core comprising a BPSG film; and a step following the above step so as to form a second conductive film for storage node on the substrate including said core of cylindrical storage node;

wherein in said sixth step, said first and second conductive films for storage node are patterned for forming a cylindrical storage node comprised of said first and second conductive films for storage node;

said process still further including a step conducted after said sixth step and prior to said seventh step so as to remove by etching said core of the cylindrical storage node;

wherein said supporting film serves as an etching stopper film in said sixth step and said step to remove the core of the cylindrical storage node.

4. A process for fabrication of a semiconductor device as set forth in claim 3, further including a step conducted after said third step and prior to said fourth step so as to form a film for gap production on said supporting film;

said fourth step wherein said contact hole is so formed as to extend through said film for gap production, as well;

said step to remove the core of the cylindrical storage node wherein said film for gap production is also removed thereby exposing a surface of said cylindrical storage node that contacts said film for gap production;

said seventh step wherein said second insulating film is deposited for coverage over the exposed surfaces of said cylindrical storage node and said supporting film.

5. A process for fabrication of a semiconductor device as set forth in claim 1, further including a step conducted after said second step and prior to said third step so as to deposit on the substrate an insulating film for edge retention having a high etching selectivity to said first insulating film;

wherein in said third step, said contact hole is so formed as to extend through said insulating film for edge retention, as well.

6. A process for fabrication of a semiconductor device functioning as a stacked DRAM cell comprising the steps of:

a first step to deposit a first insulating film on a substrate having an impurity diffusion layer, the first insulating film having a property of ref lowing due to a heat treatment under predetermined conditions;

a second step to perform a first heat treatment under said predetermined conditions thereby causing said first insulating film to reflow for planarization thereof;

a third step following said second step so as to form a supporting film having a property of not reflowing due to a heat treatment under said predetermined conditions;

a fourth step to lay over said supporting film an etching stopper film utilized during a formation of a cylindrical storage node;

a fifth step to form a contact hole extending through said etching stopper film, supporting film and first insulating film and to said impurity diffusion layer;

a sixth step to deposit a first conductive film for storage node on the substrate including said contact hole;

a seventh step following said sixth step so as to form a core of cylindrical storage node on said first conductive film for storage node;

an eighth step following said seventh step so as to form a second conductive film for storage node on the substrate including said core of cylindrical storage node;

a ninth step to pattern said first and second conductive films for storage node for forming a cylindrical storage node comprised of said first and second conductive films for storage node;

a tenth step following said ninth step so as to remove by etching said core of the cylindrical storage node;

an eleventh step following said tenth step so as to deposit a second insulating film comprising a silicon nitride film for coverage over a surface of said cylindrical storage node and an exposed surface of said supporting film;

a twelfth step following said eleventh step so as to perform a second heat treatment under said predetermined conditions thereby oxidizing a surface of said second insulating film for forming a capacitor insulating film comprising an oxidized silicon nitride film; and a thirteenth step following said twelfth step so as to form a conductive film for plate electrode on the substrate;

wherein in said twelfth step, a stress against deformation of said second insulating film and said etching stopper film caused by said second heat treatment is applied thereto by said supporting film.

7. A process for fabrication of a semiconductor device as set forth in claim 6, further including a step following said thirteenth step so as to form on the substrate a third insulating film having a property of reflowing due to a heat treatment under said predetermined conditions; and a step following the above step so as to perform a third heat treatment under said predetermined conditions thereby causing said third insulating film to reflow for planarization thereof;

wherein in said planarization step for the third insulating film, a stress against deformation of said second insulating film and said etching stopper film caused by said third heat treatment is applied thereto by said supporting film.

8. A process for fabrication of a semiconductor as set forth in claim 6, further including a step to form a film for gap production on said etching stopper film;

said fifth step wherein said contact hole is so formed as to extend through said film for gap production, as well;

said step for removal of said core of the cylindrical storage node wherein said film for gap production is also removed thereby to expose a surface of said cylindrical storage node that contacts said film for gap production;

wherein in said eleventh step, said second film is deposited for coverage over the exposed surfaces of said cylindrical storage node and said supporting film.

9. A process for fabrication of a semiconductor device as set forth in claim 6, further including a step conducted after said second step and prior to said third step so as to deposit on the substrate an insulating film for edge retention having a high etching selectivity to said first insulating film;

wherein in said fifth step, said contact hole is so formed as to extend through said insulating film for edge retention, as well.

* * * * *